(12) United States Patent
Wright et al.

(10) Patent No.: US 7,267,043 B2
(45) Date of Patent: Sep. 11, 2007

(54) ACTUATORS WITH DIAPHRAGM AND METHODS OF OPERATING SAME

(75) Inventors: David D. Wright, Vershire, VT (US); James Vogeley, Yorktown, VA (US); Edward T. Tanner, Williamsburg, VA (US)

(73) Assignee: Adaptivenergy, LLC, Hampton, VA (US)

( * ) Notice: Subject to any disclaimer, the term of this patent is extended or adjusted under 35 U.S.C. 154(b) by 0 days.

(21) Appl. No.: 11/104,670

(22) Filed: Apr. 13, 2005

(65) Prior Publication Data

US 2006/0146096 A1 Jul. 6, 2006

Related U.S. Application Data

(63) Continuation-in-part of application No. 11/024,943, filed on Dec. 30, 2004.

(51) Int. Cl.
*F01B 19/00* (2006.01)
*F15B 21/04* (2006.01)

(52) U.S. Cl. ............................. 92/103 R; 92/1; 60/473

(58) Field of Classification Search ................ 60/473, 60/475, 486, 545; 92/1, 96, 98 R, 103 R
See application file for complete search history.

(56) References Cited

U.S. PATENT DOCUMENTS

| | | | |
|---|---|---|---|
| 4,401,857 A | | 8/1983 | Morikawa |
| 4,773,218 A | * | 9/1988 | Wakita et al. ................ 60/473 |
| 4,853,579 A | | 8/1989 | Kawasaki et al. .......... 310/116 |
| 4,927,084 A | | 5/1990 | Brandner et al. |
| 4,939,405 A | | 7/1990 | Okuyama et al. ............ 310/330 |
| 5,070,848 A | | 12/1991 | Mitsuyasu .................... 123/506 |
| 5,759,015 A | | 6/1998 | Van Lintel et al. |
| 5,811,911 A | | 9/1998 | Jänker et al. |
| 6,042,345 A | | 3/2000 | Bishop et al. |

(Continued)

FOREIGN PATENT DOCUMENTS

JP 57-199399 A 12/1982

(Continued)

OTHER PUBLICATIONS

International Search Report and Written Opinion mailed Nov. 21, 2006 in corresponding PCT application PCT/US2006/13857.

(Continued)

*Primary Examiner*—Michael Leslie
(74) *Attorney, Agent, or Firm*—Nixon & Vanderhye, P.C.

(57) ABSTRACT

Actuator assemblies comprise an actuator element and two piezoelectric assemblies, with the two piezoelectric assemblies being configured and arranged for controlling movement of the actuator element. In some example implementations, the first piezoelectric assembly and the second piezoelectric assembly are constructed and arranged so that a temperature dependency of the first piezoelectric assembly is cancelled by the temperature dependency of the second piezoelectric assembly. In a first example embodiment, a first piezoelectric assembly comprises a first or main piezoelectric diaphragm connected to the actuator element for displacing the actuator element in response to displacement of the first piezoelectric diaphragm. The first piezoelectric diaphragm and the second piezoelectric diaphragm are fixedly mounted to a movable carriage. In second example embodiment, first variable reservoir having a first piezoelectric diaphragm contracts and a second variable reservoir having a second piezoelectric diaphragm expands during an extension movement of the actuator element, and vise versa during a withdrawal movement of the actuator element.

24 Claims, 23 Drawing Sheets

U.S. PATENT DOCUMENTS

| | | |
|---|---|---|
| 6,120,264 A | 9/2000 | Wang |
| 6,229,245 B1 | 5/2001 | Kitani .................... 310/316.02 |
| 6,246,152 B1 | 6/2001 | Fontanella et al. ......... 310/317 |
| 6,411,009 B2 | 6/2002 | Jaenker ................. 310/316.01 |
| 6,637,200 B2 | 10/2003 | Barba et al. |
| 6,659,978 B1 | 12/2003 | Kasuga et al. ............... 604/151 |
| 6,751,954 B2 * | 6/2004 | Bridger et al. ................ 60/475 |
| 6,761,028 B2 * | 7/2004 | Takeuchi et al. .............. 60/486 |
| 6,784,599 B1 | 8/2004 | Stoecktein et al. |
| 6,811,093 B2 | 11/2004 | Rado |
| 6,869,275 B2 | 3/2005 | Dante et al. |
| 6,969,941 B1 | 11/2005 | Kapps et al. .......... 310/316.01 |
| 2004/0018100 A1 | 1/2004 | Takagi et al. ............... 417/322 |
| 2005/0244288 A1 | 11/2005 | O'Neill ................... 417/413.2 |
| 2005/0258715 A1 * | 11/2005 | Schlabach .................. 310/331 |
| 2006/0147325 A1 | 7/2006 | Vogeley |

FOREIGN PATENT DOCUMENTS

| | | |
|---|---|---|
| JP | 57-211562 | 12/1982 |
| JP | 62-150051 | 7/1987 |
| JP | 62-186077 | 8/1987 |
| JP | 02-248671 | 10/1990 |
| JP | 03-015674 | 1/1991 |
| JP | 03-168373 | 7/1991 |
| JP | 06-117377 | 4/1994 |

OTHER PUBLICATIONS

International Search Report and Written Opinion mailed May 8, 2007 in PCT application PCT/US06/13854.

\* cited by examiner

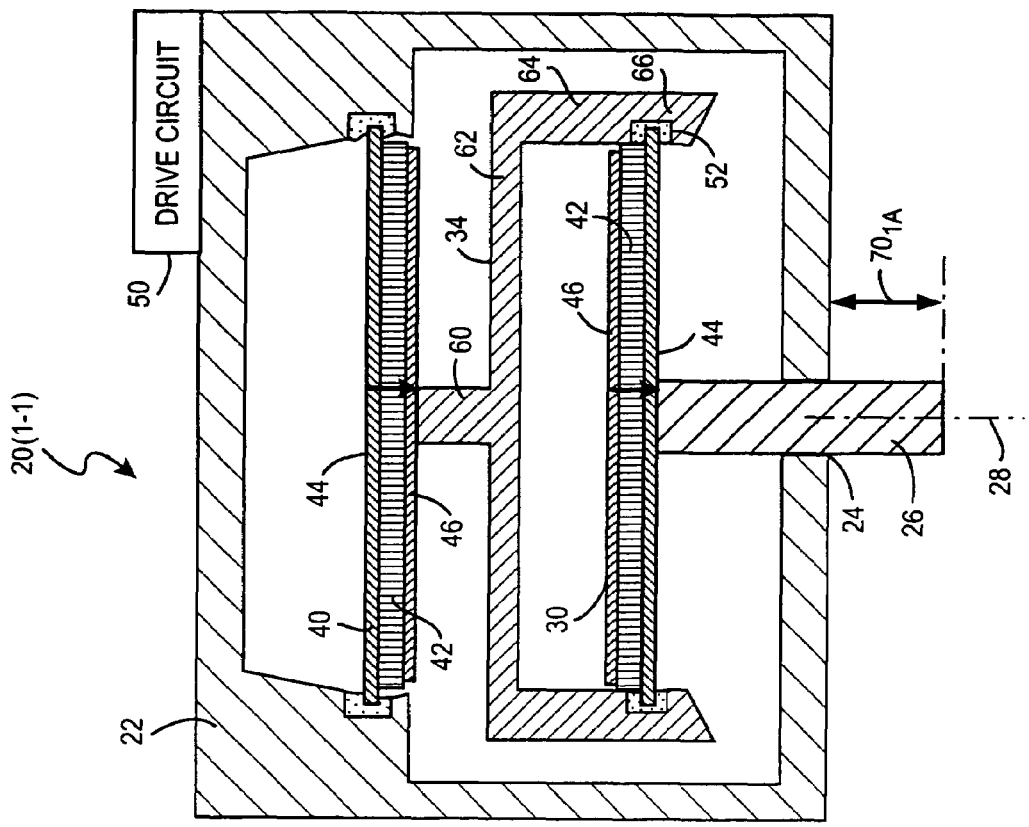
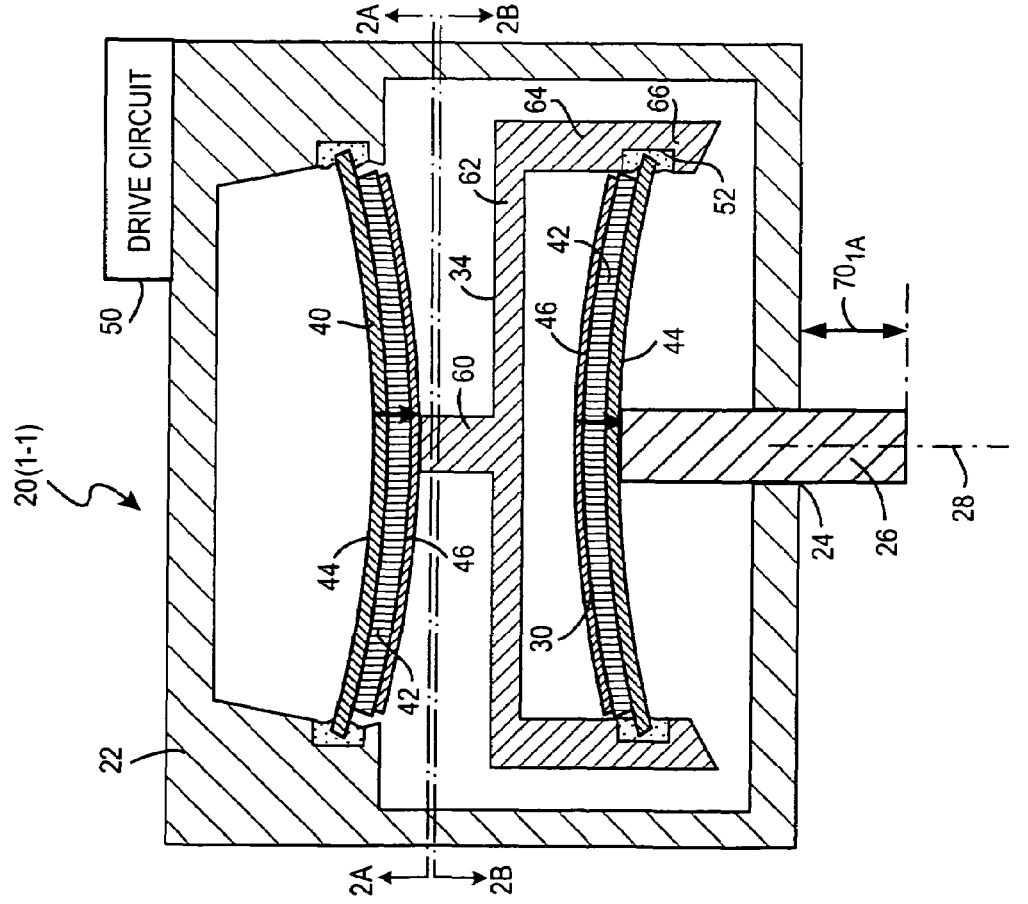

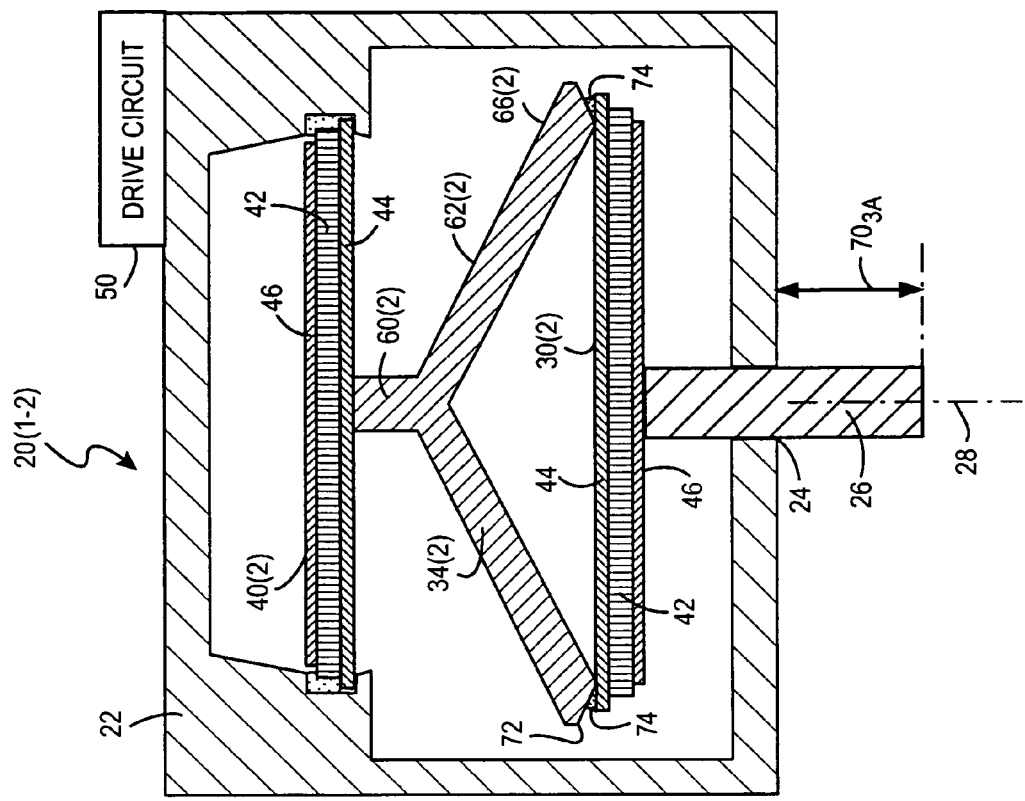
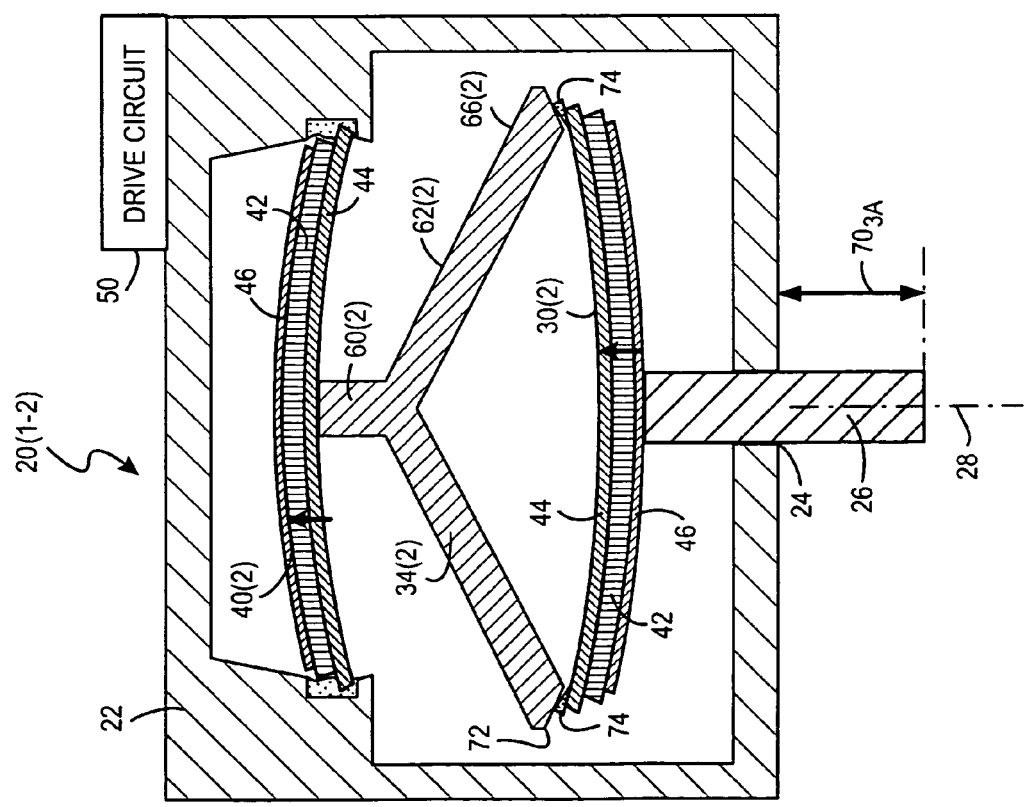
Fig. 3A(1)
Fig. 3A(2)

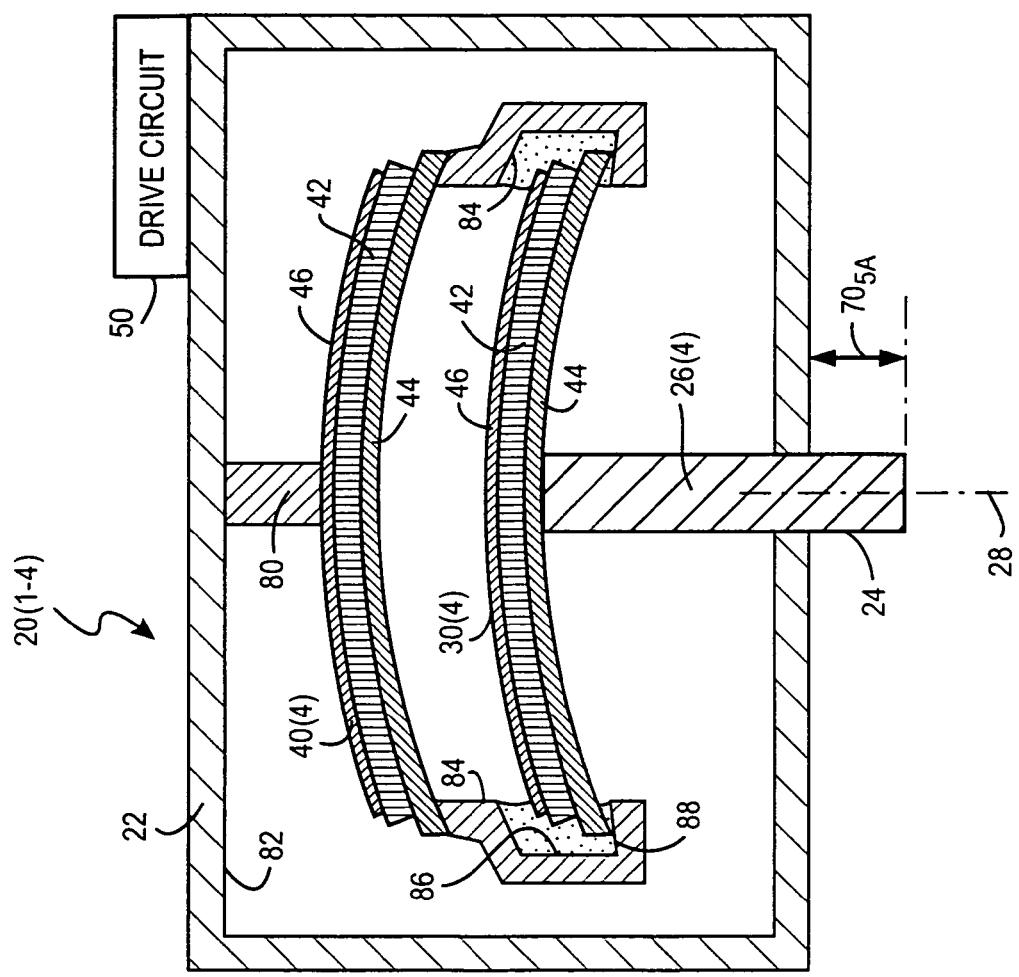

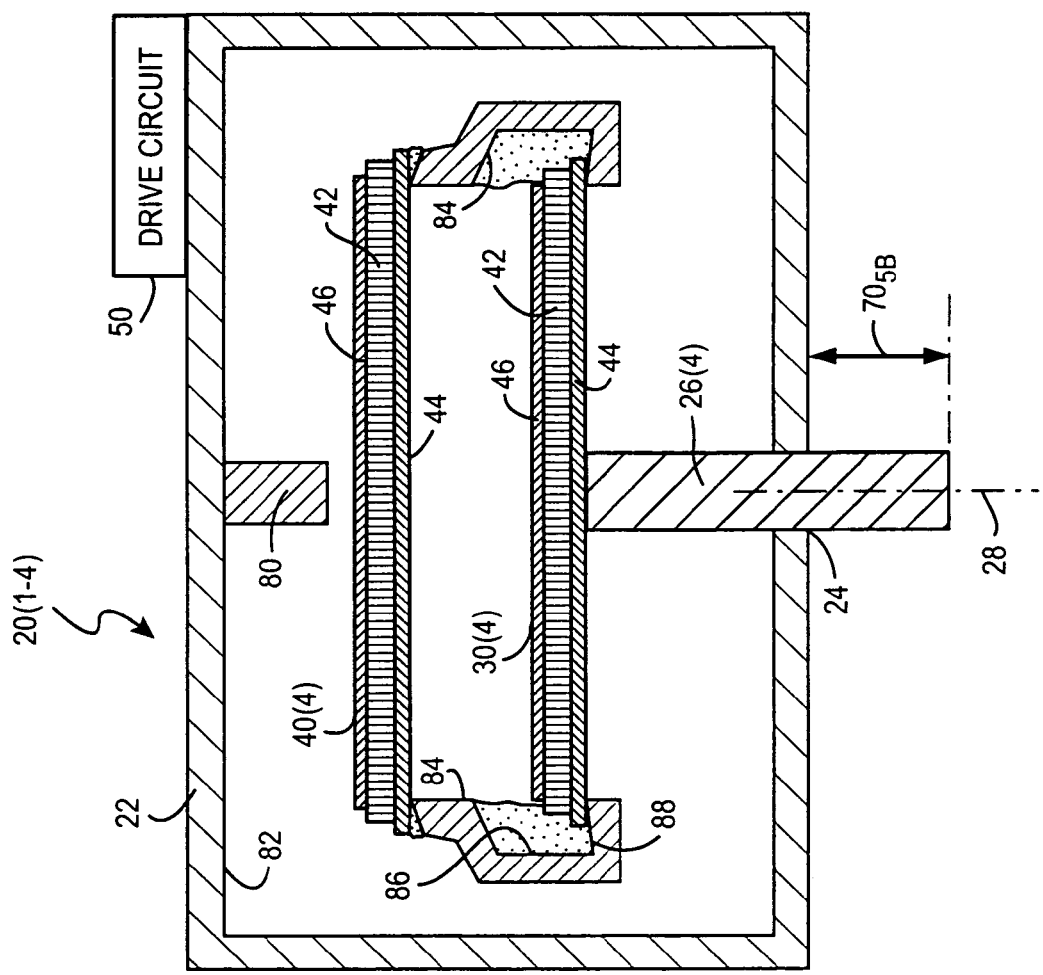

ACTUATORS WITH DIAPHRAGM AND METHODS OF OPERATING SAME

This application is a continuation-in-part of U.S. patent application Ser. No. 11/024,943, filed Dec. 30, 2004, entitled "PUMPS WITH DIAPHRAGMS BONDED AS BELLOWS", which is incorporated herein by reference in its entirety.

BACKGROUND

1. Field of the Invention

The present invention pertains to actuators which comprise a piezoelectric diaphragm, including actuators which comprise a piezoelectric diaphragm and techniques for compensating for temperature-dependent behavior of a piezoelectric diaphragm.

2. Related Art and Other Considerations

Diaphragms can be used for many purposes such as, for example, an actuator in a pump or as a driving part of a mechanical actuator for other applications. While many different types of diaphragms exist and many materials have been utilized for diaphragms, piezoelectric elements have proven to be one of the more promising materials for diaphragm construction. A piezoelectric material is permanently-polarized and will produce an electric field when the material changes dimensions as a result of an imposed mechanical force. This phenomenon is known as the piezoelectric effect. Conversely, an applied electric field can cause a piezoelectric material to change dimensions. This phenomenon is known as electrostriction, or the reverse piezoelectric effect.

In accordance with the reverse piezoelectric effect, a piezoelectric diaphragm can deflect or change its degree of curvature upon application of an electric field. Example piezoelectric diaphragms, methods of making piezoelectric diaphragms, and pumps incorporating the same are described in PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", and simultaneously filed U.S. Provisional Patent Application 60/670,692), entitled "PIEZOELECTRIC DIAPHRAGM ASSEMBLY WITH CONDUCTORS ON FLEXIBLE FILM", all of which are incorporated herein by reference.

Piezoelectric materials have many significant features and advantages. One potential disadvantage is that the behavior of piezoelectric materials can be temperature dependent. In a diaphragm formed with a piezoelectric layer, for example, apart from electric field considerations, the degree of curvature of the piezoelectric layer (and thus the diaphragm generally) can change as its temperature increases. For example, a piezoelectric element having a slight curvature or crown tends to flatten as its temperature increases. Such flattening or change of curvature of the piezoelectric may present a problem when the piezoelectric diaphragm is expected to perform in a consistently accurate manner. For example, if the piezoelectric diaphragm is connected or linked to an actuator whose movement or displacement must be accurately controlled, the flattening or curvature change of the diaphragm thwarts precise positioning of the actuator. In other words, if the degree of curvature of a piezoelectric diaphragm prior to application of the electric field changes from a nominal initial curvature to a more flattened initial curvature due to a factor such as temperature, the final degree of curvature of the piezoelectric diaphragm upon application of the electric field will not be the expected final degree of curvature.

What is needed, therefore, and an object of the present invention, is apparatus, method, and/or technique for compensating for temperature dependent behavior of a piezoelectric diaphragm.

BRIEF SUMMARY

Example implementations pertain to actuator assemblies which comprise an actuator element and two piezoelectric assemblies, with the two piezoelectric assemblies being configured and arranged for controlling movement of the actuator element. In some example implementations, the first piezoelectric assembly and the second piezoelectric assembly are constructed and arranged so that a temperature dependency of the first piezoelectric assembly is cancelled by the temperature dependency of the second piezoelectric assembly. In some example implementations, one of the piezoelectric assemblies (e.g., the main piezoelectric assembly) is carried or suspended from the other of the piezoelectric assemblies (e.g., the carriage piezoelectric assembly) to enhance actuator extension stroke or displacement. In various example embodiments, temperature compensation/cancellation and actuator extension enhancement are both advantageously obtained.

In a first example embodiment, a first piezoelectric assembly comprises a first or main piezoelectric diaphragm connected to the actuator element for displacing the actuator element in response to displacement of the first piezoelectric diaphragm. The first piezoelectric diaphragm is mounted to a movable carriage. A second piezoelectric diaphragm, which comprises the second piezoelectric assembly, is connected to the carriage for displacing the carriage in response to displacement of the second piezoelectric diaphragm. A driver applies electrical signals to the first piezoelectric diaphragm and the second piezoelectric diaphragm for causing the first piezoelectric diaphragm and the second piezoelectric diaphragm to displace in the same direction.

In the first example embodiment, the second piezoelectric diaphragm essentially cooperates with the carriage to form a suspension system for the first piezoelectric diaphragm, for which reason the second piezoelectric diaphragm is also referred to as the "carrying" or "carriage" diaphragm. Some implementations of this first embodiment provide temperature compensation, and yet as a separate and distinct aspect hereof the use of compound diaphragms (e.g., the main diaphragm and the carriage diaphragm) provides, e.g., increased actuator stroke length.

In one example implementation, one of the first piezoelectric diaphragm and the second piezoelectric diaphragm has a concave shape when unactivated and another of the first piezoelectric diaphragm and the second piezoelectric diaphragm has a convex shape when unactivated. As employed herein for the first embodiment, concavity and convexity are assessed from a vantage point of the actuator and with respect to an actuator axis of the actuator element. For example, with respect to the actuator axis, the first piezoelectric diaphragm may have the concave shape when unactivated and the second piezoelectric diaphragm may have the convex shape when unactivated. Alternatively, the first or main piezoelectric diaphragm may have the convex shape when unactivated and the second or carriage piezoelectric diaphragm may have the concave shape when unactivated.

In another example implementation of the first example embodiment, with respect to the actuator axis both the first piezoelectric diaphragm and the second piezoelectric diaphragm have a concave shape when unactivated.

The example first embodiment may also include a housing. In one variation of the first example embodiment, a fluid reservoir is situated within the housing, with an aperture of the housing serving as a port for the reservoir. The actuator element selectively opens and closes the aperture, and thus serves as a valve for the fluid reservoir.

In a second example embodiment, the actuator element is at least partially situated in a housing wherein the actuator element is capable of reciprocating movement. With respect to the housing, the actuator element at least partially defines a first variable fluidic chamber and a second variable fluidic chamber. A first piezoelectric assembly comprises a first variable reservoir connected to the first variable fluidic chamber; a second piezoelectric assembly comprises a second variable reservoir connected to the second variable fluidic chamber. Both the first variable reservoir and the second variable reservoir are at least partially formed with a piezoelectric material. A first working fluid occupies the first variable reservoir and the first variable fluidic chamber; a second working fluid occupies the second variable reservoir and the second variable fluidic chamber. A driver applies signals to the piezoelectric material comprising the first variable reservoir and the second variable reservoir for causing the first variable reservoir to contract and the second variable reservoir to expand during an extension movement of the actuator element, and for causing the first variable reservoir to expand and the second variable reservoir to contract during a withdrawal movement of the actuator element.

In the second embodiment, the first piezoelectric assembly and the second piezoelectric assembly may each comprise one or two diaphragms, e.g., piezoelectric diaphragms. In implementations in which the first piezoelectric assembly and the second piezoelectric assembly each comprise two diaphragms, the diaphragms of each assembly may either be essentially directly bonded together at their edges, or may be coupled together (and preferably spaced apart) by spacer(s).

Thus, in one example implementation of the second embodiment, the first variable reservoir and the second variable reservoir each comprise a first diaphragm having a first diaphragm edge and a second diaphragm having a second diaphragm edge. The first diaphragm edge and the second diaphragm edge are bonded together so that a variable reservoir volume is formed between the first diaphragm and the second diaphragm. At least one of the first diaphragm and the second diaphragm is a piezoelectric diaphragm which displaces in accordance with application of an electrical signal.

In another example implementation of the second embodiment, a displacement sensor is provided for detecting a degree of displacement of the actuator element and for generating a feedback signal for application to the driver.

In yet another example implementation of the second embodiment, the two diaphragms of the first piezoelectric assembly and the two second piezoelectric assembly are, within each assembly, coupled together (and preferably spaced apart) by spacer(s). The two piezoelectric diaphragms of a piezoelectric assembly may be configured in arranged with concavity or convexity in similar manner as the example implementations of the first embodiment in order to provide, e.g., thermal compensation advantages.

In example implementations of the second embodiment, the housing of the actuator can be configured for achieving force or stroke by, e.g., appropriately configuring the first variable fluidic chamber of the housing.

The actuator assemblies have myriad purposes and can be incorporated in or utilized with other elements or devices. For example, the actuator element may be connected, coupled, or linked to a spool valve or a servo valve.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1A(1) is a sectioned side view of an actuator assembly according to a first example implementation of a first example embodiment for illustrating a situation in which no electrical signal is applied to either a main diaphragm or a carrier diaphragm of the actuator assembly and in which the main diaphragm and the carrier diaphragm are not thermally stressed.

FIG. 1A(2) is a sectioned side view of the actuator assembly of FIG. 1A(1) for illustrating a situation in which no electrical signal is applied to either the main diaphragm or the carrier diaphragm of the actuator assembly but in which the main diaphragm and the carrier diaphragm are thermally stressed.

FIG. 3A(1) is a sectioned side view of an actuator assembly according to a second example implementation of the first example embodiment for illustrating a situation in which no electrical signal is applied to either the main diaphragm or the carrier diaphragm of the actuator assembly and in which the main diaphragm and the carrier diaphragm are not thermally stressed.

FIG. 3A(2) is a sectioned side view of the actuator assembly of FIG. 2A(1) and illustrating a situation in which no electrical signal is applied to either the main diaphragm or the carrier diaphragm of the actuator assembly but in which the main diaphragm and the carrier diaphragm are thermally stressed.

FIG. 5A is a sectioned side view of an actuator assembly according to a four example implementation of the first example embodiment for illustrating a situation in which no electrical signal is applied to either the main diaphragm or the carrier diaphragm of the actuator assembly.

FIG. 5B is a sectioned side view of the actuator assembly of FIG. 4A and illustrating a situation in which a positive electrical signal is applied to the main diaphragm and the carrier diaphragm.

DETAILED DESCRIPTION OF THE DRAWINGS

Figure 1B:
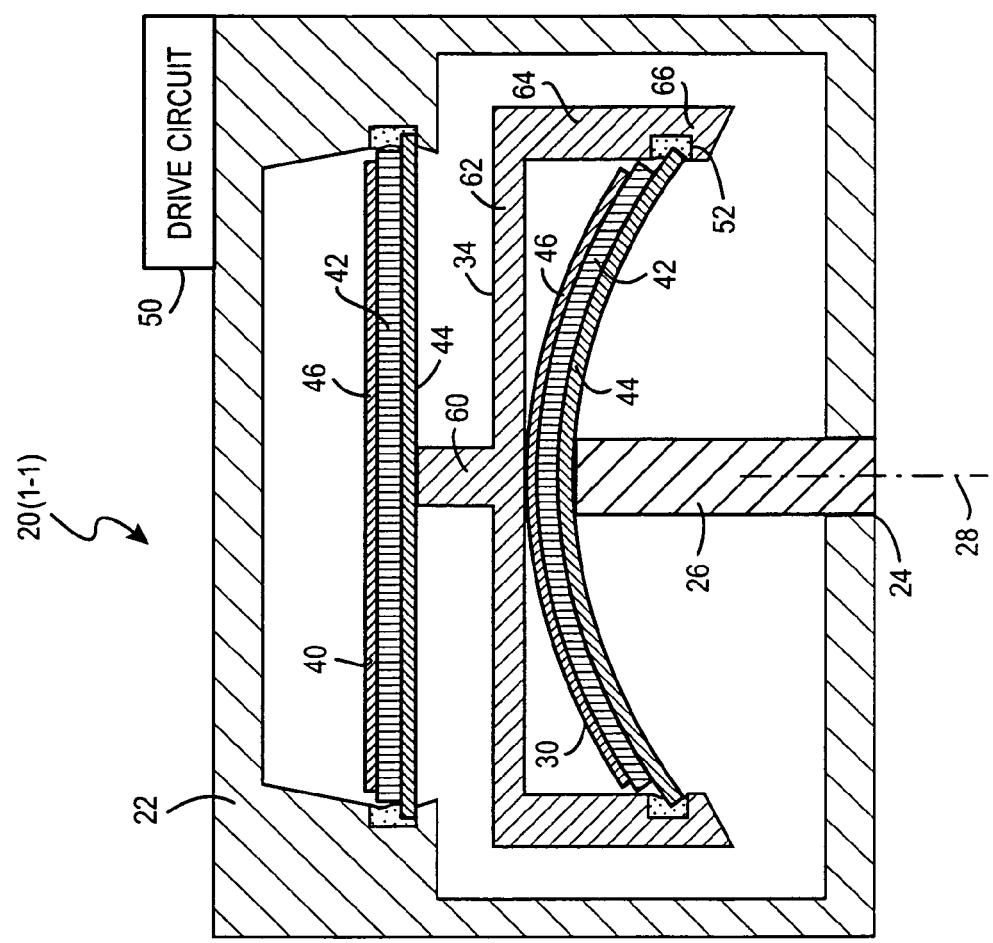
FIG. 1B is a sectioned side view of the actuator assembly of FIG. 1A(1) for illustrating a situation in which a positive electrical signal is applied to the main diaphragm and the carrier diaphragm.

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

Example implementations pertain to actuator assemblies which comprise an actuator element and two piezoelectric assemblies, with the two piezoelectric assemblies being configured and arranged for controlling movement of the actuator element. In some example implementations, the first piezoelectric assembly and the second piezoelectric assembly are constructed and arranged so that a temperature dependency of the first piezoelectric assembly is cancelled by the temperature dependency of the second piezoelectric assembly. In some example implementations, one of the piezoelectric assemblies (e.g., the main piezoelectric assembly) is carried or suspended from the other of the piezoelectric assemblies (e.g., the carriage piezoelectric assembly) to enhance actuator extension stroke or displacement. In various example embodiments, temperature compensation/cancellation and actuator extension enhancement are both advantageously obtained.

In a first example embodiment, the first piezoelectric assembly comprises a first or main piezoelectric diaphragm connected to the actuator element for displacing the actuator element in response to displacement of the first piezoelectric diaphragm. The first piezoelectric diaphragm is mounted to a movable carriage. A second piezoelectric diaphragm, which comprises the second piezoelectric assembly, is connected to the carriage for displacing the carriage in response to displacement of the second piezoelectric diaphragm. A driver applies electrical signals to the first piezoelectric diaphragm and the second piezoelectric diaphragm for causing the first piezoelectric diaphragm and the second piezoelectric diaphragm to displace in the same direction.

In the first example embodiment, the second piezoelectric diaphragm essentially cooperates with the carriage to form a suspension system for the first piezoelectric diaphragm, for which reason the second piezoelectric diaphragm is also referred to as the "carrying" or "carriage" diaphragm. Implementations of this first embodiment have the temperature compensation or cancellation feature, but as a separate and distinct aspect here of the use of compound diaphragms (e.g., the main diaphragm and the carriage diaphragm) also provides, e.g., increased actuator stroke length.

FIG. 1A(1) shows an actuator assembly 20(1-1) according to a first example implementation of the first example embodiment. The actuator assembly 20(1-1) comprises a housing 22 having a port 24 through which a distal end of an actuator element 26 extends. In accordance with actuation by the actuator assembly 20(1-1), the distal end of the actuator element 24 selectively extends or retracts relative to port 24.

The actuation (e.g., retracting and extension) of actuator element 26 is facilitated by other components preferably situated at least partially in housing 22. Among these components is a first or "main" piezoelectric diaphragm 30. The main piezoelectric diaphragm 30 is connected to actuator element 26. As main piezoelectric diaphragm 30 displaces or moves in a direction parallel to the main axis 28 of actuator element 26, so does the actuator element 26 in view of the coupling of actuator element 26 and diaphragm 30. In other words, the actuator element 26 moves or is displaced between its extended position and its retracted position in response to displacement of main piezoelectric diaphragm 30.

The actuator assembly 20(1-1) further comprises movable carriage 34 and a second or "carriage" piezoelectric diaphragm 40. Preferably both carriage 34 and carriage piezoelectric diaphragm 40 are at least partially situated within housing 22. The main piezoelectric diaphragm 30 is mounted on or held by carriage 34. The carriage piezoelectric diaphragm 40 is connected carriage 34, and preferably carriage 34 is suspended from carriage piezoelectric diaphragm 40. In view of the fact that carriage piezoelectric diaphragm 40 itself is displaceable (e.g., displaceable in one mode in a direction parallel to main axis 28), the carriage piezoelectric diaphragm 40 serves for displacing carriage 34 in response to displacement of carriage piezoelectric diaphragm 40. Thus, carriage piezoelectric diaphragm 40 essentially cooperates with the carriage 34 to form a suspension system for main piezoelectric diaphragm 30.

The main piezoelectric diaphragm 30 and carriage piezoelectric diaphragm 40 can take various forms. In one example configuration and in the illustrations of the numerous non-limiting implementations described herein, both main piezoelectric diaphragm 30 and carriage piezoelectric diaphragm 40 are ruggedized laminated piezoelectric devices, e.g., multi-layered laminates. Such multi-layered laminates comprise a piezoelectric wafer 42 which is laminated by an adhesive between a metallic substrate layer 44 (e.g., stainless steel) and an outer metal layer 46 (aluminum). Example structures of such multi-layered laminate and processes for fabricating the same are described in one or more of the following (all of which are incorporated herein by reference in their entirety): PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", and and simultaneously filed U.S. Provisional Patent Application 60/670,692, entitled "PIEZOELECTRIC DIAPHRAGM ASSEMBLY WITH CONDUCTORS ON FLEXIBLE FILM".

The actuator assembly 20(1-1) further comprises a driver, such as driver circuit 50. The driver circuit 50 serves for applying electrical signals to main piezoelectric diaphragm 30 and carriage piezoelectric diaphragm 40, and does so in a manner to cause main piezoelectric diaphragm 30 and carriage piezoelectric diaphragm 40 to move or displace in a same direction. The driver circuit 50 can be mounted to housing 22, either within or without, and can take various forms including a printed circuit board, circuit card, or the like. To facilitate simplified view of the drawings, the electrical connections of driver circuit 50 to main piezoelectric diaphragm 30 and carriage piezoelectric diaphragm 40 are not illustrated. In a positive drive mode, a positive lead is connected to outer metal layer 46 and a negative lead to substrate layer 44 of each piezoelectric diaphragm. Conversely, in a negative drive mode, a negative lead is connected to outer metal layer 46 and a positive lead to substrate layer 44. FIG. 1A(1) illustrates a situation in which no electrical signal is applied to either main piezoelectric diaphragm 30 or carriage piezoelectric diaphragm 40, and in which main piezoelectric diaphragm 30 and carriage piezoelectric diaphragm 40 are not thermally stressed.

As seen from above, both main piezoelectric diaphragm 30 and carriage piezoelectric diaphragm 40 are circular disks which, in absence of electrical signal and thermal stress, are slightly bowed as shown in FIG. 1A(1). In the example implementation of FIG. 1A(1), and as seen from the distal end of actuator element 26 along its main axis 28, as unactivated (e.g., absence of electrical signal) and in absence of any thermal degradation the main piezoelectric diaphragm 30 has a slightly concave shape and carriage piezoelectric diaphragm 40 has a slightly convex shape.

In one example, non-limiting configuration, the radius of substrate layer 44 is larger than the radius of piezoelectric wafer 42 and outer metal layer 46, with the result that the circumference or periphery of substrate layer 44 serves as a clamping edge by which both main piezoelectric diaphragm 30 and carriage piezoelectric diaphragm 40 can be retained within clamping notches 52 and 54 provided in housing 22 and carriage 34, respectively. As in other implementations and embodiments described herein after, the peripheries of the diaphragms 30 and 40 can be secured within the respective clamping notches 52, 54 or otherwise to their mounting structure by any suitable mechanism which allows the piezoelectric diaphragms to expand and contract radially while minimizing the motion of the piezoelectric diaphragms in the actuation direction. Such retaining mechanism can be an adhesive, for example, such as 3M™ Scotch-Weld™ Translucent DP-190 Epoxy. Other unillustrated means may be provided for retaining, wedging, or securing the periphery of substrate layer 44 within the respective clamping notch, such as washers or O-rings or the like. In view of such retention, the mode of displacement of the piezoelectric wafer 42 comprising the main piezoelectric diaphragm 30 and carriage piezoelectric diaphragm 40 is in an axial direction (e.g., parallel to main axis 28) rather than in a radial direction of the piezoelectric diaphragms.

The carriage 34 can be configured in many ways, and such configurations may differ from implementation to implementation of the first example embodiment. In the specific configuration illustrated in of FIG. 1A(1), carriage 34 comprises a carriage neck 60; carriage shoulders 62; carriage arms 64; and carriage grippers 66. The carriage neck 60 extends parallel to main axis 28 and is connected to an underside of outer metal layer 46. The carriage shoulders 62 extend laterally and radially from a base of carriage neck 60. While the particular configuration shown in FIG. 2A and FIG. 2B has a plurality (e.g., eight) of radially-extending discrete carriage shoulders 62, it should be understood that a greater or fewer number of shoulders may be provided, and that the shoulder may be essentially a solid unitary piece if preferred. The carriage arms 64 extend orthogonally to carriage shoulders 62 and essentially parallel to main axis 28. The clamping notches 54 are provided on interior surfaces of carriage grippers 66. The periphery of main piezoelectric diaphragm 30, and particularly the peripheral edge or clamping edge of piezoelectric wafer 42 of main piezoelectric diaphragm 30 is retained by carriage grippers 66 in clamping notches 54 as before mentioned.

A top end of actuator element 26 is connected to an underside of substrate is layer 44 of main piezoelectric diaphragm 30, with a distal end of actuator element 26 extending through port 24 provided at the bottom of housing 22. The actuator element 26 may be secured to main piezoelectric diaphragm 30 by any suitable means, such as by an adhesive, a mechanical connection, laser or other welding, for example. In one or more such example ways the top end of carriage neck 60 is also secured to the underside of carriage piezoelectric diaphragm 40.

The shape and configuration of various elements, such as housing 22 and carriage 34, for example, are merely illustrative as many other configurations and designs are possible. Moreover, it will be appreciated that while the main piezoelectric diaphragm 30 and carriage piezoelectric diaphragm 40 preferably comprise the multi-laminate structure aforementioned, the basic principles taught herein are not limited to any particular piezoelectric diaphragm structure.

As mentioned above, FIG. 1A(1) shows actuator assembly 20(1-1) with main piezoelectric diaphragm 30 and carriage piezoelectric diaphragm 40 unactivated (e.g., no electrical signal) and in absence of any thermal degradation. When actuator assembly 20(1-1) is operated in the positive drive mode as discussed above, the non-activation of main piezoelectric diaphragm 30 and carriage piezoelectric diaphragm 40 puts actuator element 26 in its extended position. In FIG. 1A(1), such extension of actuator element 26 beyond port 24 of housing 22 is represented by distance $70_{1A(1)}$.

Figure 2B:
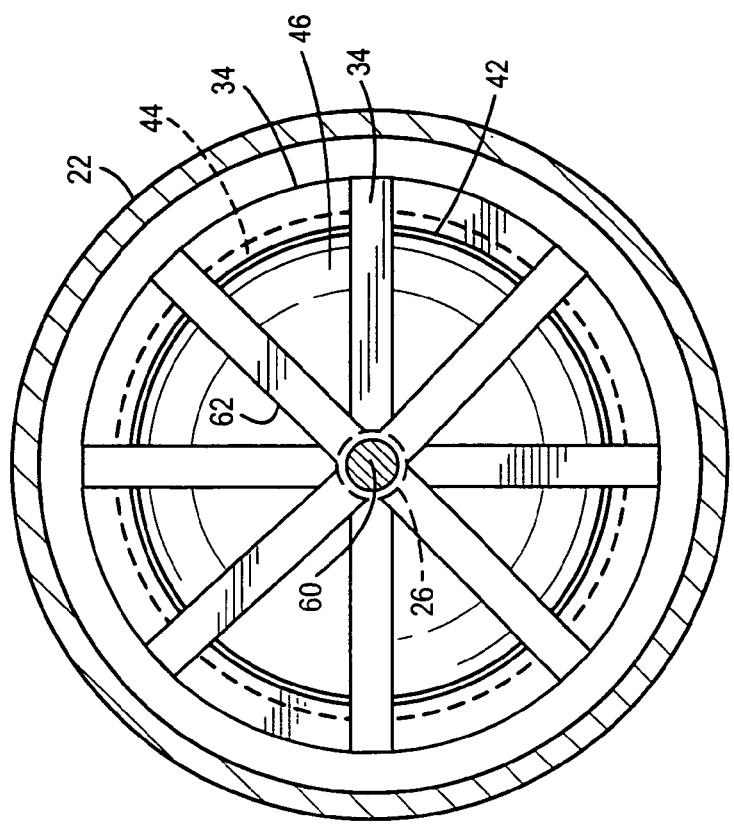
FIG. 2B is a plan view taken along line 2B-2B of FIG. 1A.
Figure 2A:
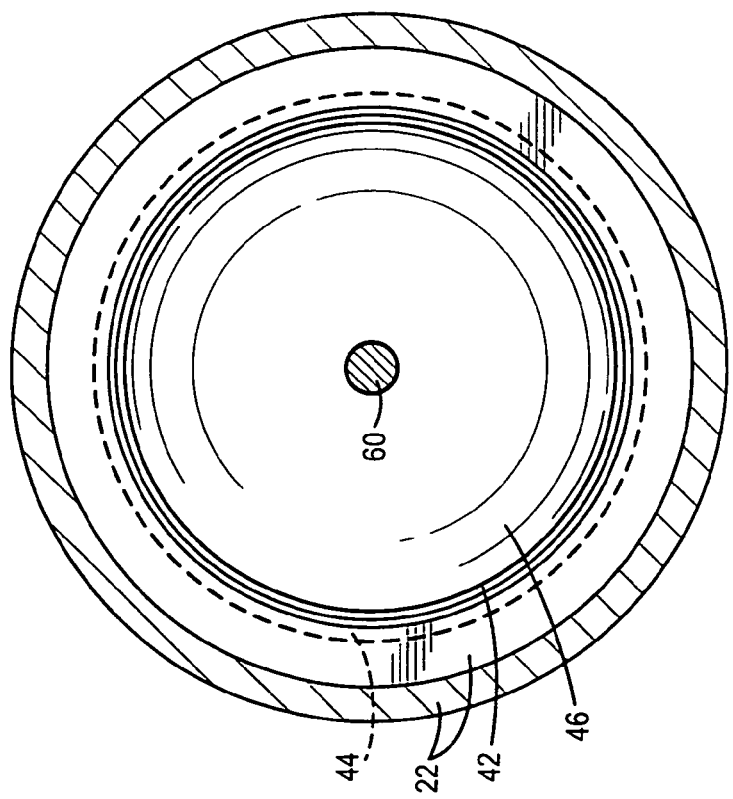
FIG. 2A is a plan view taken along line 2A-2A of FIG. 1A.

For the positive drive mode, FIG. 1B illustrates the movement or deflection of main piezoelectric diaphragm 30 and carriage piezoelectric diaphragm 40 upon activation (e.g., applying an electrical signal) of main piezoelectric diaphragm 30 and carriage piezoelectric diaphragm 40. As such, FIG. 1B shows the consequential displacement of actuator element 26 to a retracted position. It just so happens that retraction of actuator element 26 in FIG. 1B results in the distal end of actuator element 26 being essentially flush with the mouth of port 24.

FIG. 1B shows the displacement of carriage piezoelectric diaphragm 40 upon activation to be essentially a flattening of the diaphragm, which tends to draw or carriage 34 and the main piezoelectric diaphragm 30 engaged thereby. As used herein, "flattening" does not necessarily mean that the diaphragm acquires a completely flat orientation, but rather than the diaphragm tends to a smaller degree of curvature. Activation of main piezoelectric diaphragm 30, on the other hand, results in a more concave deflection of main piezoelectric diaphragm 30, which results in retraction of actuator element 26 along its main axis 28.

Figure 1C:
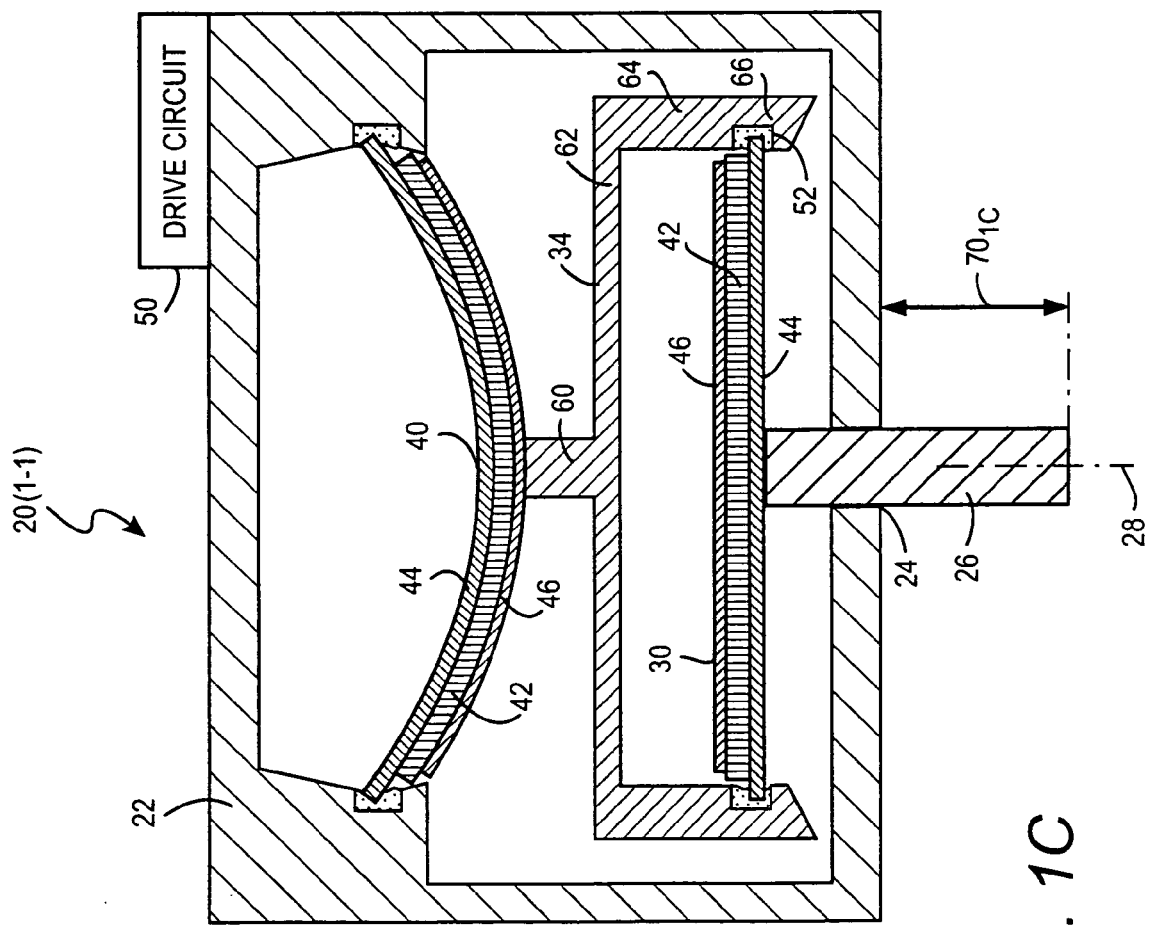
FIG. 1C is a sectioned side view of the actuator assembly of FIG. 1A(1) for illustrating a situation in which a negative electrical signal is applied to the main diaphragm and the carrier diaphragm.

In terms of the negative drive mode, FIG. 1A(1) (in which main piezoelectric diaphragm 30 and carriage piezoelectric diaphragm 40 are unactivated) represents the retracted position of actuator element 26 (the opposite of the depiction by FIG. 1A(1) of the positive drive mode). FIG. 1C shows the extension of the actuator element 26 when both main piezoelectric diaphragm 30 and carriage piezoelectric diaphragm 40 are activated in the negative drive mode. Upon activation in the negative drive mode, the convexness of carriage piezoelectric diaphragm 40 increases (e.g., carriage piezoelectric diaphragm 40 becomes more bowed) and main piezoelectric diaphragm 30 tends to flatten from its previously slightly concave shape. The respective displacements of main piezoelectric diaphragm 30 and carriage piezoelectric diaphragm 40 thus serve to extend actuator element 26 further from housing 22, e.g., by a distance $70_{1C}$ as shown in FIG. 1C. Thus, the distance $70_{1C}$ is greater than distance $70_{1A(1)}$.

In some applications it may be important for an actuator assembly such as the actuator assembly 20(1-1) to have its actuator element 26 consistently and precisely position in both its retracted position and its extended position. For example, it may be important or critical that the actuator element 26 be extended beyond port 24 of housing 22 by the distance $70_{1A(1)}$ (in the positive drive mode of FIG. 1B) or by the distance $70_{1C}$ (in the negative drive mode) in order to coact or interface with another part or piece of equipment that is driven or actuated by actuator element 26.

As mentioned previously, piezoelectric materials can be temperature dependent. It may be, for example, that main piezoelectric diaphragm 30 and carriage piezoelectric diaphragm 40, by virtue of the piezoelectric wafer 42 comprising them, may tend to flatten (e.g., have a smaller degree of curvature) as temperature of the 1o environment and of the piezoelectric wafer 42 increases. Such curvature change or flattening of the piezoelectric may present a problem when the piezoelectric diaphragm is expected to perform in a consistently accurate manner, e.g. to precisely and consistently extend actuator element 26 connected thereto to a specific distance. The precise extension may be necessary, for example, for connection or linking to a device which expects to be driven by actuator element 26 and is positioned under assumption that it will be contacted and/or moved by the precisely extended actuator element 26.

Advantageously, the actuator assembly 20(1-1) of FIG. 1A(1) is constructed so that a temperature dependency of main piezoelectric diaphragm 30 is cancelled by the temperature dependency of carriage piezoelectric diaphragm 40. That is, any deformation or temperature distortion (e.g., flattening) of main piezoelectric diaphragm 30 is cancelled by a similar but opposite deformation or temperature distortion of carriage piezoelectric diaphragm 40.

In the above regard, FIG. 1A(2) shows the same actuator assembly 20(1-1) as FIG. 1A(1), but with the actuator assembly 20(1-1) having undergone sufficient heating or thermal condition such the main piezoelectric diaphragm 30 has somewhat flattened from its essentially concave configuration as shown in FIG. 1A(1). Had actuator assembly 20(1-1) comprised only main piezoelectric diaphragm 30, the flattening of the main piezoelectric diaphragm 30 would have undesirably extended actuator element 26 further from housing 22 than the precisely required distance $70_{1A}$. Yet the suspension system of actuator assembly 20(1-1) comprises carriage piezoelectric diaphragm 40, which preferably is constructed identically to carriage piezoelectric diaphragm 40 (or at least constructed to respond identically to the prevailing thermal conditions). As such, carriage piezoelectric diaphragm 40 also changes degree of curvature (e.g., flattens) to the same degree as main piezoelectric diaphragm 30, but in a different direction in order to cancel out the distortion of main piezoelectric diaphragm 30. In other words, just as main piezoelectric diaphragm 30 tends to flatten from its concave orientation relative to main axis 28, carriage piezoelectric diaphragm 40 tends to flatten from its convex orientation. Therefore, any extra extension of actuator element 26 that would have occurred by flattening of main piezoelectric diaphragm 30 is cancelled, since the flattening of carriage piezoelectric diaphragm 40 causes the carriage 34 to be lifted within actuator assembly 20(1-1) by a same amount as the would-be extra extension. With the carriage 34 thusly lifted by the flattening of carriage piezoelectric diaphragm 40, the further extension of actuator element 26 (that otherwise would occur because of the flattening of main piezoelectric diaphragm 30) is negated. Thus, as shown in FIG. 1A(2), even in the thermally elevated situation wherein the main piezoelectric diaphragm 30 flattens (as does carriage piezoelectric diaphragm 40), the actuator element 26 extends the distance $70_{1A}$ from port 24 of housing 22, just as in the ambient situation of FIG. 1A(1).

The temperature compensation/cancellation effect above described with respect to FIG. 1A(1) and FIG. 1A(2) is, of course, operative as well when the main piezoelectric diaphragm 30 and carriage piezoelectric diaphragm 40 are activated, whether such activation be in accordance with the positive drive mode or the negative drive mode. Any tendency for the main piezoelectric diaphragm 30 and carriage piezoelectric diaphragm 40 to flatten or distort due, e.g., to temperature or other environmental condition, is experienced directionally inversely by main piezoelectric diaphragm 30 and carriage piezoelectric diaphragm 40, with the result that distortion tendencies are essentially cancelled.

In addition, provision of two diaphragms and displacement of the two diaphragms provides a compound influence for displacing the actuator element 26. The displacement afforded by the two diaphragms 30 and 40 serve to provide greater displacement of the actuator element 26 in contrast to the actuator element 26 being driven by only one diaphragm. In some embodiments, the greater displacement may approach essentially twice the displacement of a single diaphragm apparatus.

FIG. 3A(1) illustrates a second example implementation of the first embodiment, i.e., actuator assembly 20(1-2). In the actuator assembly 20(1-2) of the second example implementation, and as seen from the distal end of actuator element 26 along its main axis 28, when unactivated (e.g., absence of electrical signal) and in absence of any thermal degradation the main piezoelectric diaphragm 30(2) has a slightly convex shape and carriage piezoelectric diaphragm 40(2) has a slightly concave shape. As such, in the second example embodiment of FIG. 3A(1), the it is the substrate layer 44 to which carriage 34(2) is mounted, e.g., from which carriage 34(2) is suspended and actuator element 26 is mounted to outer metal layer 46 of main piezoelectric diaphragm 30(2). The orientations and attachment layers of the main piezoelectric diaphragm 30(2) and carriage piezoelectric diaphragm 40(2) of the second example implementation are thus opposite those of the first example implementation of the first embodiment.

Figure 3B:
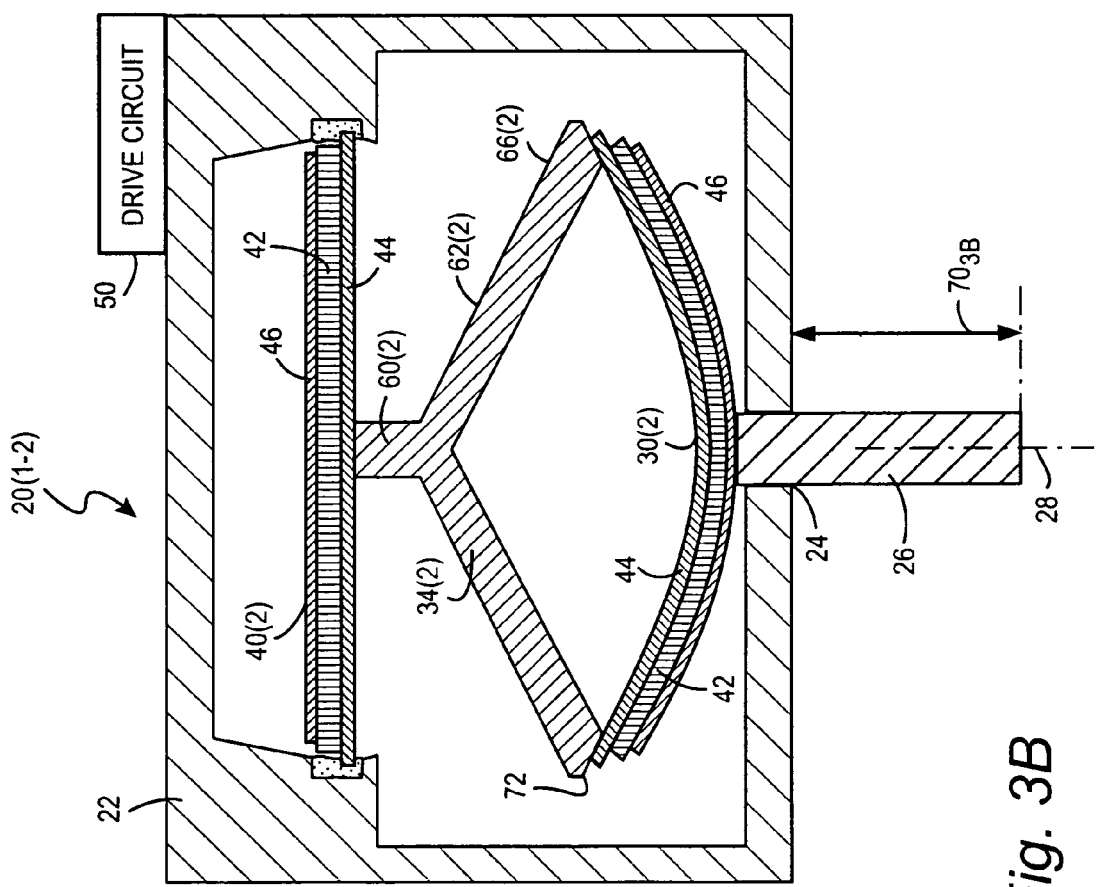
FIG. 3B is a sectioned side view of the actuator assembly of FIG. 2A(1) and illustrating a situation in which a positive electrical signal is applied to the main diaphragm and the carrier diaphragm.

The second example implementation of FIG. 3A(1) also differs from the first example implementation in the configuration of its carriage 34(2). Whereas the carriage neck 60 and carriage shoulders 62 of the first example implementation are essentially orthogonal to each other, the carriage neck 60(2) and carriage shoulders 62(2) of the second example implementation are inclined at less than a ninety degree angle. This alternate configuration illustrates that the carriage 34 may be shaped, sized, or oriented in order to accommodate, e.g., the displacement direction of the main piezoelectric diaphragm and the carriage piezoelectric diaphragm. In addition, the carriage arms 64 of the second example implementation differ by not having carriage grippers 66, but instead by having distal ends whose undersides are beveled, tapered, or otherwise formed to provide a suitable mating or mounting surface 72 for the periphery of main piezoelectric diaphragm 30(2). The periphery of main piezoelectric diaphragm 30(2) is adhered or fastened to the carrier mounting surface 72. In some situations in may be advantageous to have a circumferential lip, shim, or wedge 74 inserted (as illustrated, for example, in FIG. 3A(1) and FIG. 3A(2), but not illustrated for sake of convenience in FIG. 3B and FIG. 3C).

FIG. 3A(1) shows the main piezoelectric diaphragm 30(2) and carriage piezoelectric diaphragm 40(2) as unactivated (e.g., no electrical signal applied thereto by driver circuit 50). With the piezoelectric diaphragms unactivated, the actuator element 26 extends through port 24 from housing 22 for a distance $70_{3A}$ as shown in FIG. 3A(1). In the positive drive mode, the position of actuator element 26 as shown in FIG. 3A(1) is considered the retracted position of actuator element 26. In contrast, FIG. 3B shows the extended position of actuator element 26 for the positive drive mode for the second example implementation of the first embodiment. In its extended position, actuator element 26 extends through port 24 from housing 22 for a distance $70_{3B}$ as shown in FIG. 3B, with distance $70_{3B}$ being greater than distance $70_{3A}$ (see FIG. 3A(1)). The extended position of FIG. 3B results from the fact that, upon being activated, the main piezoelectric diaphragm 30(2) deforms to a more convex shape than shown in FIG. 3A(1), and the carriage piezoelectric diaphragm 40(2) tends to flatten (e.g., have a 1o smaller degree of curvature) from its concave shape of FIG. 3A(1). As such, both main piezoelectric diaphragm 30(2) and carriage piezoelectric diaphragm 40(2) are displaced further along the main axis 28 so that actuator element 26 protrudes further from housing 22.

Figure 3C:
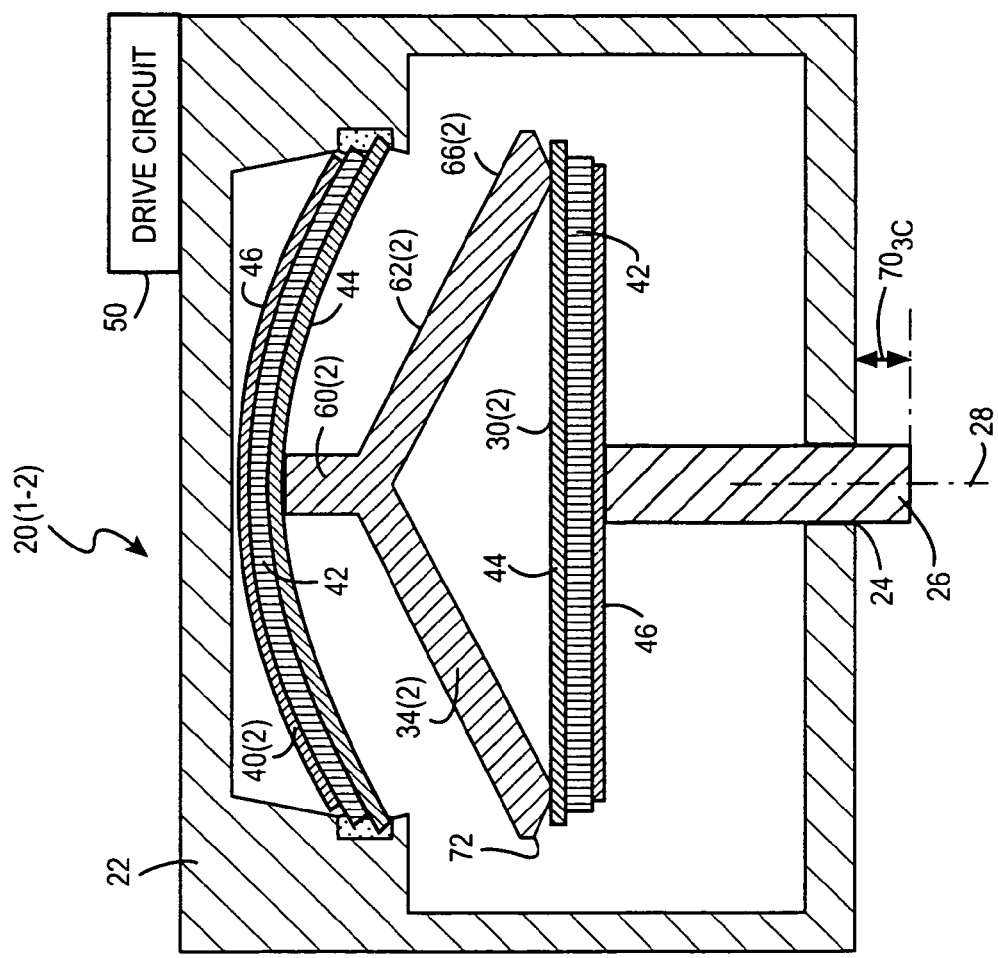
FIG. 3C is a sectioned side view of the actuator assembly of FIG. 2A(1) and illustrating a situation in which a negative electrical signal is applied to the main diaphragm and the carrier diaphragm.

In the negative drive mode, the position of actuator element 26 as shown in FIG. 3A(1) is considered the extended position of actuator element 26. In contrast, FIG. 3C shows the retracted position of actuator element 26 for the negative drive mode for the second example implementation of the first embodiment. In its retracted position, actuator element 26 extends through port 24 from housing 22 for the distance $70_{3C}$ as shown in FIG. 3C, with distance $70_{3A}$ being greater than distance $70_{3C}$ (see FIG. 3A(1)). The retracted position of FIG. 3C results from the fact that, upon being activated, the main piezoelectric diaphragm 30(2) tends to flatten (e.g., reduce its degree of curvature) from the convex shape it had in FIG. 3A(1), and the carriage piezoelectric diaphragm 40(2) tends to become even more concave than when unactivated. As such, both main piezoelectric diaphragm 30(2) and carriage piezoelectric diaphragm 40(2) are displaced further along the main axis 28 to draw actuator element 26 further into housing 22.

In like manner as FIG. 1A(2) relative to FIG. 1A(1), FIG. 3A(2) shows the same actuator assembly 20(1-2) as FIG. 3A(1), but with the actuator assembly 20(1-2) having undergone sufficient heating or thermal condition such the main piezoelectric diaphragm 30(2) has somewhat flattened from its initial essentially concave configuration as shown in FIG. 3A(1). Had actuator assembly 20(1-2) comprised only main piezoelectric diaphragm 30(2), the flattening of the main piezoelectric diaphragm 30(2) would have undesirably extended actuator element 26 further from housing 22 than the precisely required distance $70_{3A}$. Yet the suspension system of actuator assembly 20(1-2) comprises carriage piezoelectric diaphragm 40(2), which preferably is constructed identically to carriage piezoelectric diaphragm 40(2) (or at least constructed to respond identically to the prevailing thermal conditions). As such, carriage piezoelectric diaphragm 40(2) also flattens to the same degree as main piezoelectric diaphragm 30(2), but in a different direction in order to cancel out the distortion of main piezoelectric diaphragm 30(2). In other words, just as main piezoelectric diaphragm 30(2) tends to flatten from its convex orientation relative to main axis 28, carriage piezoelectric diaphragm 40(2) tends to flatten from its concave orientation.

Therefore, any retraction of actuator element 26 that would have occurred by flattening of main piezoelectric diaphragm 30(2) is cancelled, since the flattening of carriage piezoelectric diaphragm 40(2) causes the carriage 34(2) to drop further within actuator assembly 20(1-2) by a same amount as the would-be extra extension. With the carriage 34(2) thusly lowered by the flattening of carriage piezoelectric diaphragm 40(2), the further retraction of actuator element 26 (that otherwise would occur because of the is flattening of main piezoelectric diaphragm 30(2)) is negated. Thus, as shown in FIG. 3A(2), even in the thermally elevated situation wherein the main piezoelectric diaphragm 30(2) flattens (as does carriage piezoelectric diaphragm 40(2)), the actuator element 26 extends the distance $70_{3A}$ from port 24 of housing 22, just as in the ambient situation of FIG. 3A(1).

The temperature compensation/cancellation effect above described with respect to FIG. 3A(1) and FIG. 3A(2) is, of course, operative as well when the main piezoelectric diaphragm 30(2) and carriage piezoelectric diaphragm 40(2) are activated, whether such activation be in accordance with the positive drive mode or the negative drive mode. Any tendency for the main piezoelectric diaphragm 30(2) and carriage piezoelectric diaphragm 40(2) to flatten or distort due, e.g., to temperature or other environmental condition, is experienced directionally inversely by main piezoelectric diaphragm 30(2) and carriage piezoelectric diaphragm 40(2), with the result that distortion tendencies are essentially cancelled.

Figure 4A:
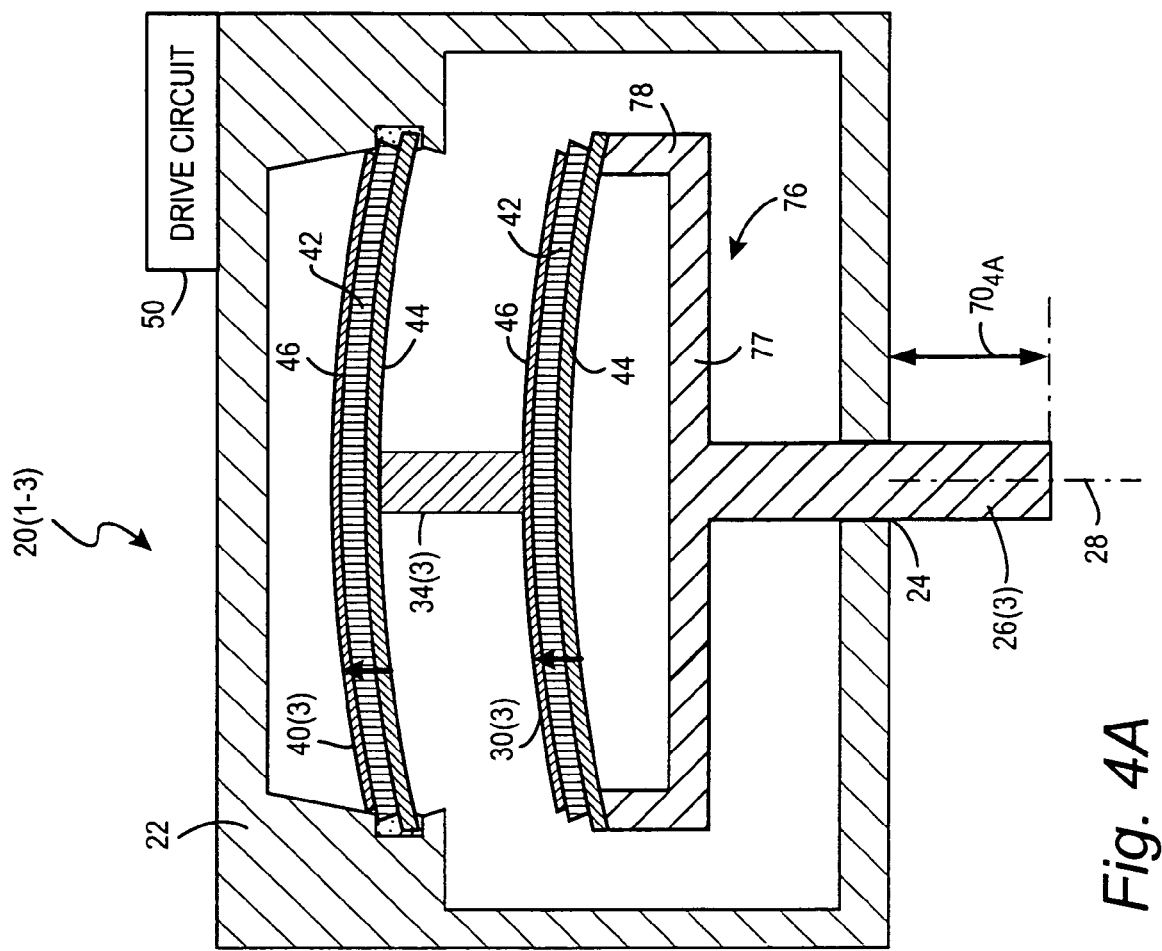
FIG. 4A is a sectioned side view of an actuator assembly according to a third example implementation of the first example embodiment for illustrating a situation in which no electrical signal is applied to either the main diaphragm or the carrier diaphragm of the actuator assembly.

FIG. 4A illustrates a third example implementation of the first embodiment, i.e., actuator assembly 20(1-3). In the actuator assembly 20(1-3) of the third example implementation, and as seen from the distal end of actuator element 26 along its main axis 28, when unactivated (e.g., absence of electrical signal) and in absence of any thermal degradation the main piezoelectric diaphragm 30(3) has a slightly concave shape and carriage piezoelectric diaphragm 40(3) has a slightly concave shape. As such, in the third example embodiment of FIG. 4A, the it is the substrate layer 44 of carriage piezoelectric diaphragm 40(3) to which carriage 34(3) is mounted, e.g., from which carriage 34(3) is suspended. Moreover, the substrate layer 44 of main piezoelectric diaphragm 30(3) is connected by yoke assembly 76 to actuator element 26(3).

The third example implementation of FIG. 4A also differs from previously described implementations in the configuration of its carriage 34(3). In the simplified form shown in FIG. 4A, the carriage 34(3) has the shape of a cylindrical rod or pillar having a first end which is attached to the underside of substrate layer 44 of carriage piezoelectric diaphragm 40(3) and a second end which is attached to the topside of outer metal layer 46 of main piezoelectric diaphragm 30(3).

The third example implementation of FIG. 4A also differs from previously described implementations by having its actuator element 26(3) connected to the underside of substrate layer 44 of main piezoelectric diaphragm 30(3) by the yoke assembly 76. In addition to actuator element 26(3), the yoke assembly 76 comprises plural yoke trusses 77 which extend radially from main axis 28 of actuator element 26(3). Rather than plural yoke trusses 77 positioned (preferably equidistantly) about main axis 28, one unified plate truss could instead be provided. While in the illustration of FIG. 4A the yoke trusses 77 extend perpendicularly from main axis 28 of actuator element 26(3), other angles of inclination may be appropriate given other geometric or spatial factors for actuator assembly 20(1-3). At their distal ends, each of the yoke trusses 77 have an upturned collar 78. Preferably the collars 78 extend parallel to main axis 28 of actuator element 26(3), and have a top surface upon which the substrate layer 44 of main piezoelectric diaphragm 30(3) can be adhered or fastened at the periphery of substrate layer 44.

Figure 4B:
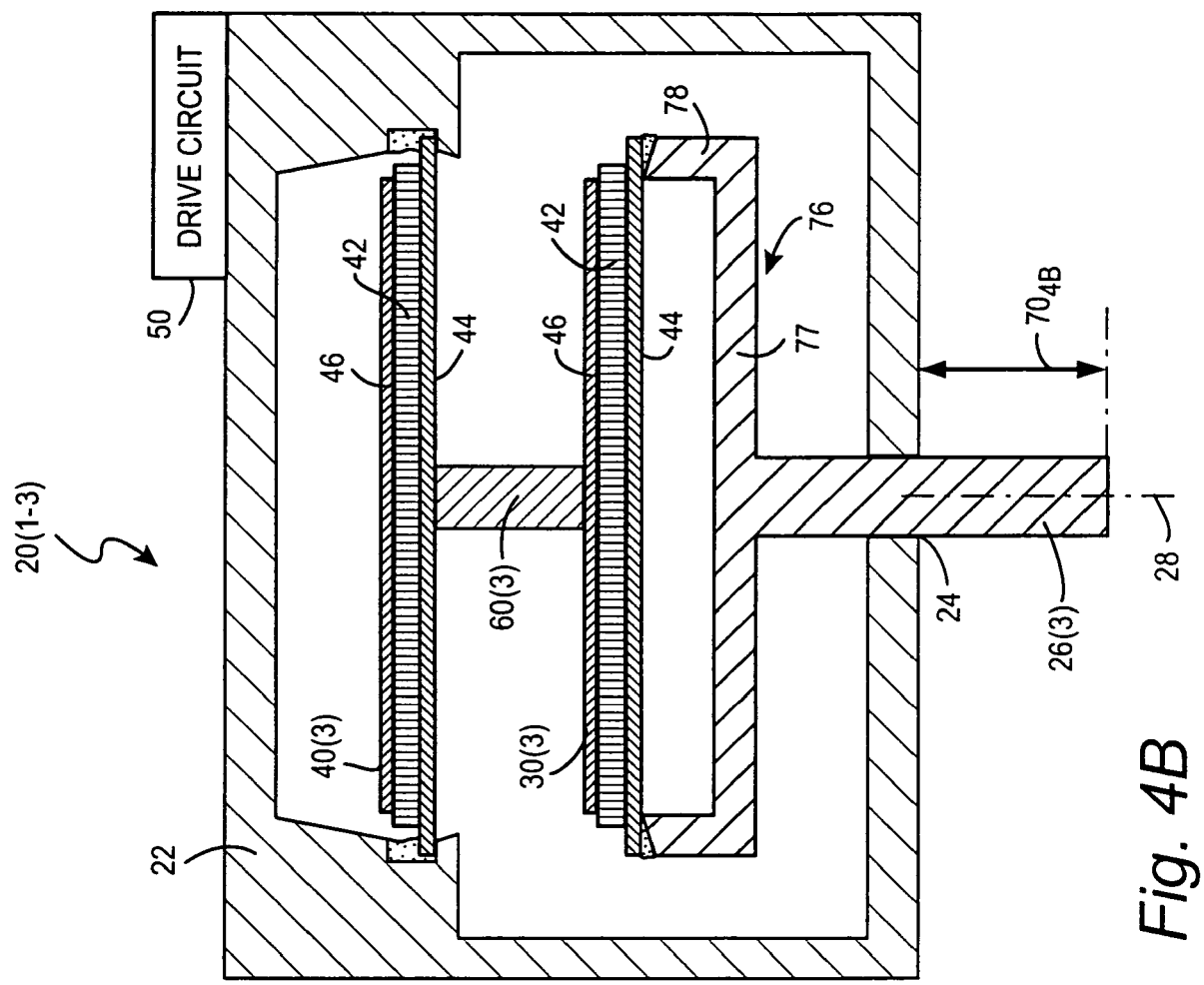
FIG. 4B is a sectioned side view of the actuator assembly of FIG. 3A and illustrating a situation in which a positive electrical signal is applied to the main diaphragm and the carrier diaphragm.

FIG. 4A shows the main piezoelectric diaphragm 30(3) and carriage piezoelectric diaphragm 40(3) as unactivated (e.g., no electrical signal applied thereto by driver circuit 50) and in absence of any thermal degradation. With the piezoelectric diaphragms unactivated, the actuator element 26(3) extends through port 24 from housing 22 for a distance $70_{4A}$ as shown in FIG. 4A. In the positive drive mode, the position of actuator element 26(3) as shown in FIG. 4A is considered the retracted position of actuator element 26(3). In contrast, FIG. 4B shows the extended position of actuator element 26(3) for the positive drive mode for the third example implementation of the first embodiment. In its extended position, actuator element 26(3) extends through port 24 from housing 22 for a distance $70_{4B}$ as shown in FIG. 4B, with distance $70_{4B}$ being greater than distance $70_{4A}$ (see FIG. 4A). The extended position of FIG. 4B results from the fact that, upon being activated, both the main piezoelectric diaphragm 30(3) and the carriage piezoelectric diaphragm 40(3) tend to displace to a flatter shape than shown in FIG. 4A. As such, both main piezoelectric diaphragm 30(3) and carriage piezoelectric diaphragm 40(3) are displaced further along the main axis 28 so that actuator element 26(3) protrudes further from housing 22 to the distance distance $70_{4B}$ which is greater than distance $70_{4A}$.

Figure 4C:
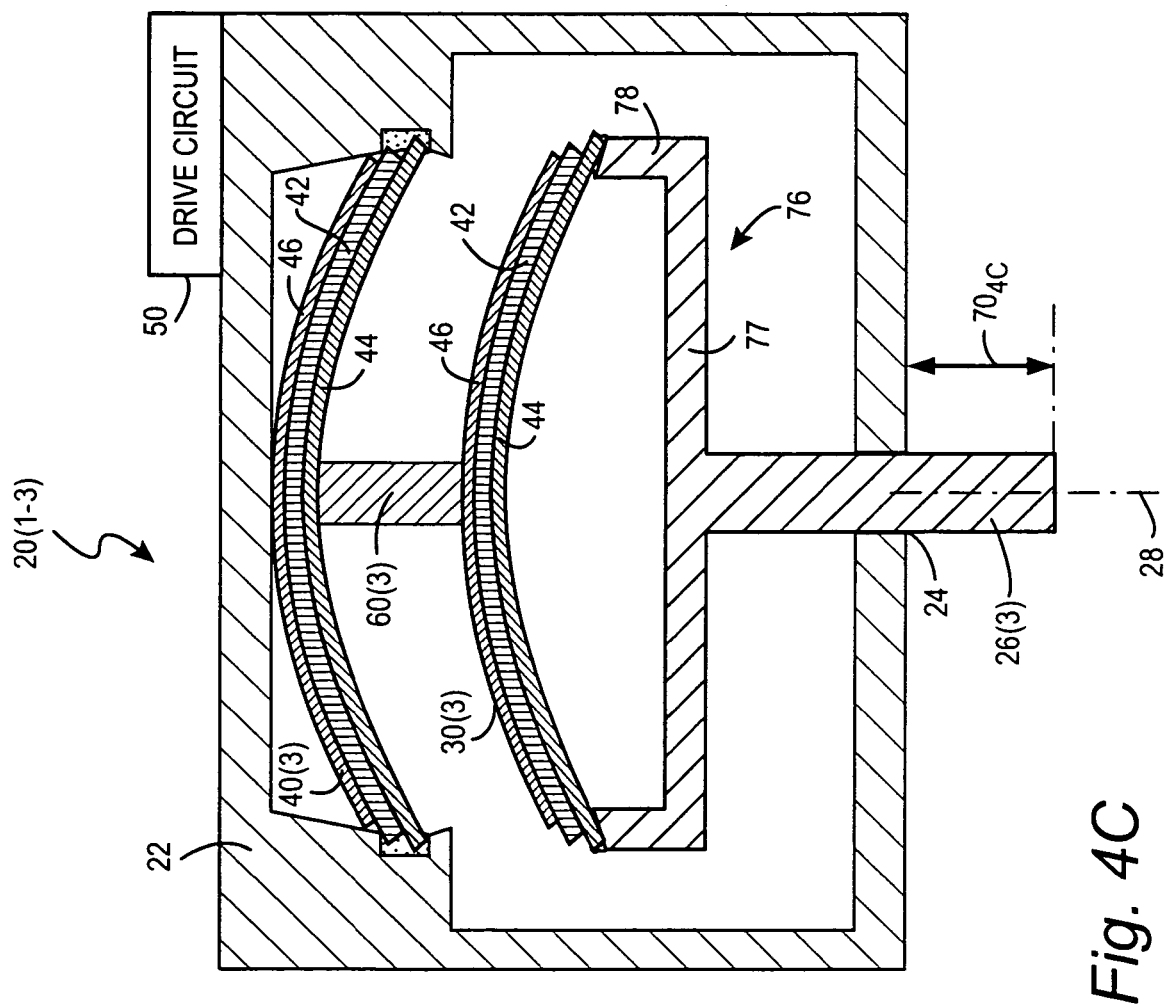
FIG. 4C is a sectioned side view of the actuator assembly of FIG. 3A and illustrating a situation in which a negative electrical signal is applied to the main diaphragm and the carrier diaphragm.

In the negative drive mode, the position of actuator element 26(3) as shown in FIG. 4A is considered the extended position of actuator element 26(3). In contrast, FIG. 4C shows the retracted position of actuator element 26(3) for the negative drive mode for the third example implementation of the first embodiment. In its retracted position, actuator element 26(3) extends through port 24 from housing 22 for the distance $70_{4C}$ as shown in FIG. 4C, with distance $70_{4A}$ being greater than distance $70_{4C}$. The retracted position of FIG. 4C results from the fact that, upon being activated, both the main piezoelectric diaphragm 30(3) and the carriage piezoelectric diaphragm 40(3) tend to become even more concave than when unactivated. As such, both main piezoelectric diaphragm 30(3) and carriage piezoelectric diaphragm 40(3) are displaced further upward along the main axis 28 to draw actuator element 26(3) further into housing 22.

Although no separate illustration is provided to show the effect of thermal strain on the actuator assembly 20(1-3) of the third example implementation of the first embodiment, it should be understood that this implementation also shares the temperature compensation/cancellation effect of the previously described implementations. Moreover, the actuator assembly 20(1-3) of the third example implementation benefit from the use of compound diaphragms (e.g., the main diaphragm and the carriage diaphragm) to provide, e.g., increased actuator stroke length.

The fourth example implementation of the first embodiment, as illustrated by FIG. 5A, is similar to the third example implementation in that, when unactivated (e.g., absence of electrical signal), both the main piezoelectric diaphragm 30(4) and carriage piezoelectric diaphragm 40(4) have a slightly concave shape and as seen from the distal end of actuator element 26 along its main axis 28. The fourth example implementation of the first embodiment differs, e.g., in the mounting of carriage piezoelectric diaphragm 40(4) and the suspension of main piezoelectric diaphragm 30(4).

In the above regard, carriage piezoelectric diaphragm 40(4) is suspended by stationary hanger 80 from an underside or ceiling 82 of housing 22(4). In the particular illustration of FIG. 5A, stationary hanger 80 has the shape of a cylindrical rod or post, although it should be understand that other shapes are also possible.

The main piezoelectric diaphragm 30(4) is, in turn, suspended from carriage piezoelectric diaphragm 40(4) by suspension bracket(s) 84. The suspension bracket(s) 84 has a top portion or neck which is adhered to an underside of substrate layer 44 of carriage piezoelectric diaphragm 40(4), proximate the periphery of substrate layer 44. The suspension bracket(s) 84 can be a unitary essentially cylindrical member which essentially extends substantially three hundred sixty degrees around main axis 28. Alternatively, plural suspension bracket(s) 84 can be provided and positioned at various angle increments around main axis 28, with the necks of the suspension bracket(s) 84 all being adhered to the underside of substrate layer 44 of carriage piezoelectric diaphragm 40(4).

The unitary or plural suspension bracket(s) 84 are formed with a groove or notch 86 on an interior surface thereof, a lowest portion of the notch 86 forming a ledge 88. The ledge 88 is positioned and sized so that a lower peripheral edge of substrate layer 44 of main piezoelectric diaphragm 30(4) can rest and be retained on the ledge 88. Depending on whether suspension bracket(s) 84 are provided as a unitary member or as plural discrete members, the periphery of main piezoelectric diaphragm 30(4) is either entirely supported by a three hundred sixty degree ledge, or by ledge segments situated at various angular positions about main axis 28 (in the case of plural suspension bracket(s) 84).

The actuator element 26(4) is illustrated as comprising a cylindrical rod or the like which is adhered centrally to the underside of substrate layer 44 of main piezoelectric diaphragm 30(4). The actuator element 26(4) extends through the port 24 formed in housing 22.

FIG. 5A shows the main piezoelectric diaphragm 30(4) and carriage piezoelectric diaphragm 40(4) as unactivated (e.g., no electrical signal applied thereto by driver circuit 50) and in absence of any thermal degradation. With the piezoelectric diaphragms unactivated, the actuator element 26(4) extends through port 24 from housing 22 for a distance $70_{5A}$ as shown in FIG. 5A. In the positive drive mode, the position of actuator element 26(4) as shown in FIG. 5A is considered the retracted position of actuator element 26(4). In contrast, FIG. 5B shows the extended position of actuator element 26(4) for the positive drive mode for the fourth example implementation of the first embodiment. In its extended position, actuator element 26(4) extends through port 24 from housing 22 for a distance $70_{5B}$ as shown in FIG. 5B, with distance $70_{5B}$ being greater than distance $70_{5A}$ (see FIG. 5A). The extended position of FIG. 5B results from the fact that, upon being activated, both the main piezoelectric diaphragm 30(4) and the carriage piezoelectric diaphragm 40(4) tend to displace to a flatter shape than shown in FIG. 5A. As such, both main piezoelectric diaphragm 30(4) and carriage piezoelectric diaphragm 40(4) are displaced further along the main axis 28 so that actuator element 26(4) protrudes further from housing 22.

Figure 5C:
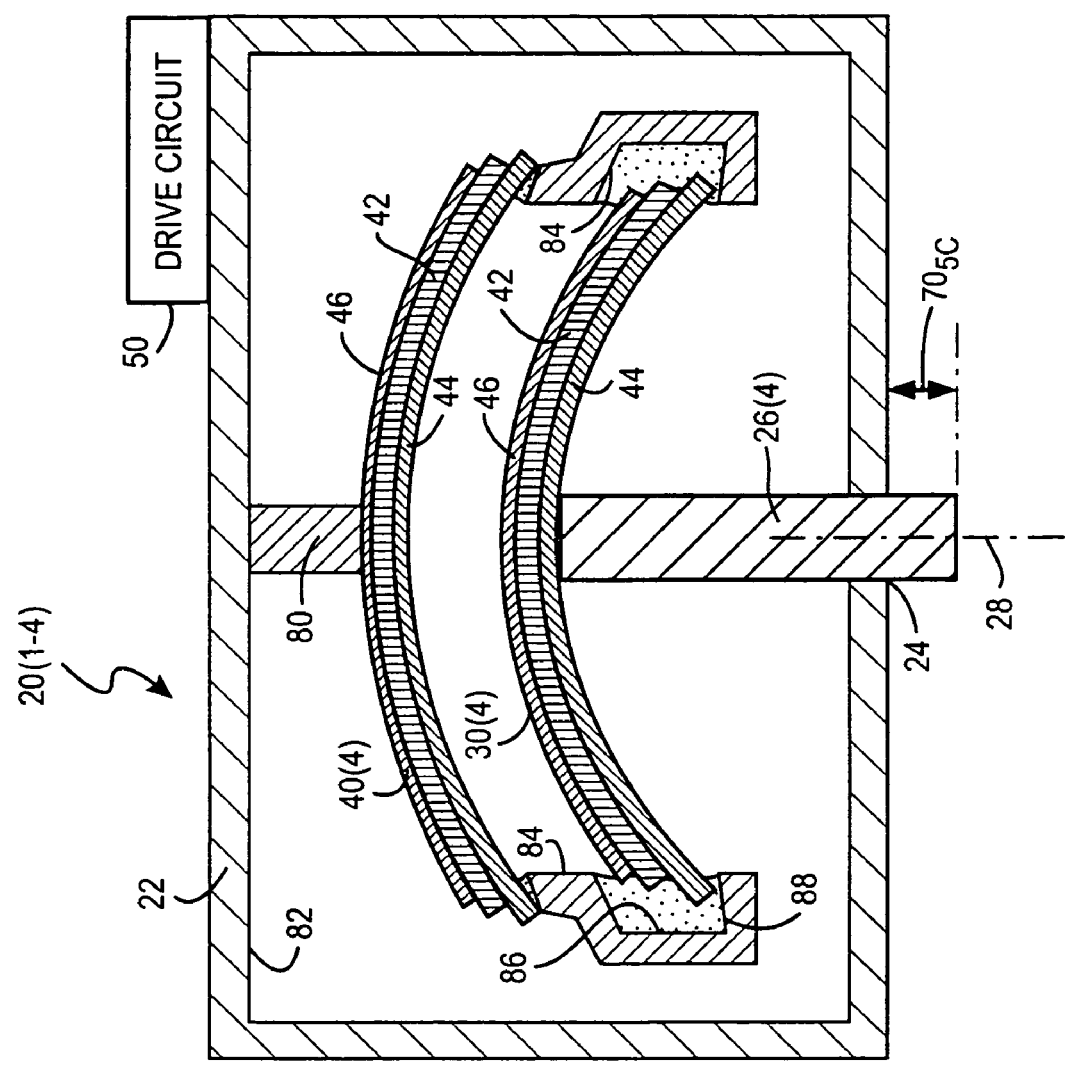
FIG. 5C is a sectioned side view of the actuator assembly of FIG. 4A and illustrating a situation in which a negative electrical signal is applied to the main diaphragm and the carrier diaphragm.

In the negative drive mode, the position of actuator element 26(4) as shown in FIG. 5A is considered the extended position of actuator element 26(4). In contrast, FIG. 5C shows the retracted position of actuator element 26(4) for the negative drive mode for the fourth example implementation of the first embodiment. In its retracted position, actuator element 26(4) extends through port 24 from housing 22 for the distance $70_{5C}$ as shown in FIG. 5C, with distance $70_{5A}$ being greater than distance $70_{5C}$. The retracted position of FIG. 5C results from the fact that, upon being activated, both the main piezoelectric diaphragm 30(4) and the carriage piezoelectric diaphragm 40(4) tend to become even more concave than when unactivated. As such, both main piezoelectric diaphragm 30(4) and carriage piezoelectric diaphragm 40(4) are displaced further upward along the main axis 28 to draw actuator element 26(4) further into housing 22.

Although no separate illustration is provided to show the effect of thermal strain on the actuator assembly 20(1-4) of the fourth example implementation of the first embodiment, it should be understood that this implementation also shares the temperature compensation/cancellation effect of the previously described implementations. Moreover, the actuator assembly 20(1-4) of the fourth example implementation benefit from the use of compound diaphragms (e.g., the main diaphragm and the carriage diaphragm) to provide, e.g., increased actuator stroke length.

The actuator assemblies described above each comprise a housing 22. In one variation of the first example embodiment illustrated as actuator assembly 20(1-5) in FIG. 6A and FIG. 6A, a fluid reservoir 90 is situated within the housing 22(6). The fluid reservoir 90 is defined by two axial walls 92 (axial in the sense of main axis 28); a bottom wall 94 of housing 22(6); and, a radial wall 96 which serves as the reservoir top wall. The fluid reservoir 90 thus has an essentially symmetrical shape to housing 22(6), so that when the main piezoelectric diaphragm 30(6) has an essentially cylindrical shape, so does fluid reservoir 90.

Figure 6B:
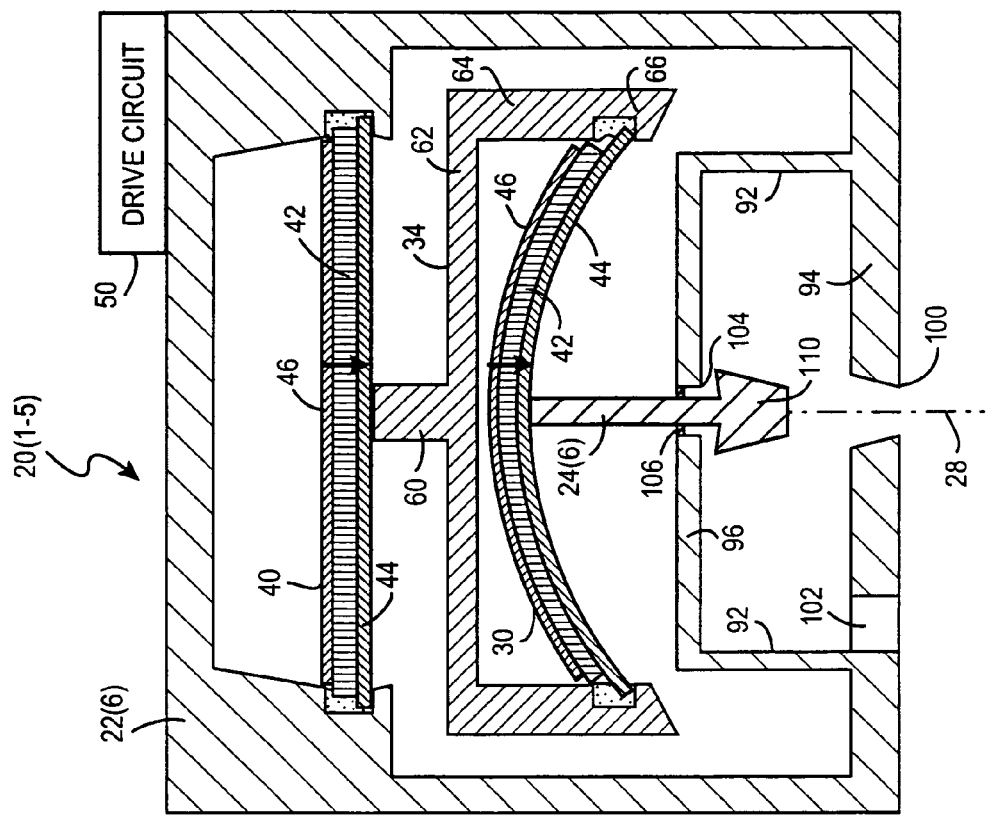
FIG. 6B is a sectioned side view of the actuator assembly of FIG. 5A for illustrating a situation in which a positive electrical signal is to both the main diaphragm and the carrier diaphragm of the actuator assembly.
Figure 6A:
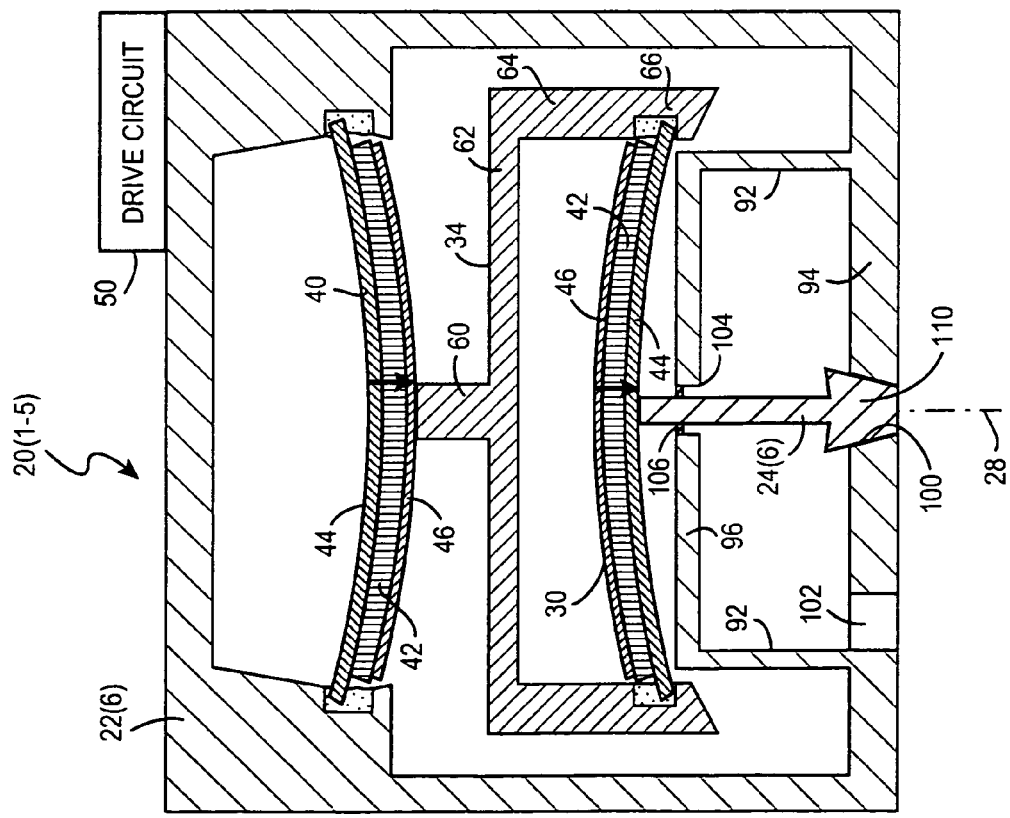
FIG. 6A is a sectioned side view of an actuator assembly according to a fifth example implementation of the first example embodiment for illustrating a situation in which no electrical signal is applied to either the main diaphragm or the carrier diaphragm of the actuator assembly, and wherein the actuator assembly functions as a valve.

The bottom wall 94 of fluid reservoir 90 has at least two ports defined therein, including first port 100 and second port 102. In the illustration of FIG. 6A and FIG. 6B, the first port is central port 100, while the second port is off-center port 102. The central port 100 is centrally aligned, e.g., with main axis 28. As a variation, there may be plural off-center ports 102 provided about main axis 28. Depending upon mode of application and use, either central port 100 may be an input port and the off-center port(s) 102 the output port(s) for fluid reservoir 90, or alternatively the off-center port(s) 102 may be the input port and central port 100 may be the output port. Typically the underside of bottom wall 94 of housing 22(6) has unillustrated fixtures or connection structure provided about central port 100 and off-center port(s) 102 so that tubes or the like can connect thereto for conveyance of fluid to and from the fluid reservoir 90.

The radial wall 96 of fluid reservoir 90 has an aperture 104 formed therein, preferably centrally about main axis 28. The reservoir aperture 104 and central port 100 are situated to be aligned with actuator element 26(6) of actuator assembly 20(1-5). In this regard, actuator element 26(6) extends through a flexible membrane or seal element 106 situated in reservoir aperture 104, so that fluid does not escape from fluid reservoir 90. The actuator element 26(6) has an enlarged stopper head 110 formed on a distal end thereof, so that when actuator element 26(6) is in its extended position, the stopper head 110 seals off central port 100 (as shown in FIG. 6A).

The variation of the first example embodiment which is illustrated in FIG. 6A and FIG. 6B happens to have a main piezoelectric diaphragm 30, a carriage piezoelectric diaphragm 40, and a carriage 34 which resemble the corresponding structures of the first example implementation of FIG. 1A and FIG. 1B. As such, when actuator assembly 20(1-5) is operated in the positive drive mode as discussed above, the non-activation of main piezoelectric diaphragm 30 and carriage piezoelectric diaphragm 40 puts actuator element 26(6) in its extended position. In FIG. 6A, such extension of actuator element 26(6) causes stopper head 110 of actuator element 26(6) to seal central port 100. On the other hand, FIG. 6B illustrates the movement or deflection of main piezoelectric diaphragm 30 and carriage piezoelectric diaphragm 40 upon activation (e.g., applying an electrical signal, in the positive drive mode) of main piezoelectric diaphragm 30 and carriage piezoelectric diaphragm 40. FIG. 6B thus shows the consequential displacement of actuator element 26(6) to a retracted position in which the stopper head 110 is not blocking central port 100, so that fluid may either ingress or egress with respect to fluid reservoir 90 as the case may be.

Thus, in the variation of actuator assembly 20(1-5), the actuator element 26(6) selectively opens and closes the aperture 100, and thus serves as a valve for the fluid reservoir 90. It should also be understood that other implementations of the first embodiment can also be utilized as a valve in similar manner as depicted in FIG. 6A and FIG. 6B. For example, the actuator assembly 20(1-2) of FIG. 3A et seq.; the actuator assembly 20(1-3) of FIG. 4A et seq.; and the actuator assembly 20(1-4) of FIG. 5 et seq. can also be formed so that the respective actuator elements thereof function as valves for a fluid reservoir in the manner of the variation of FIG. 6A and FIG. 6B. Advantageously, these valves have the same temperature compensation benefit as previously discussed with respect to the corresponding actuator assemblies. Moreover, valve structures comparable to the variation of FIG. 6A and FIG. 6B can be implemented with respect to yet other configurations of actuator assemblies which are encompassed within the spirit of the disclosed technology.

Figure 7A:
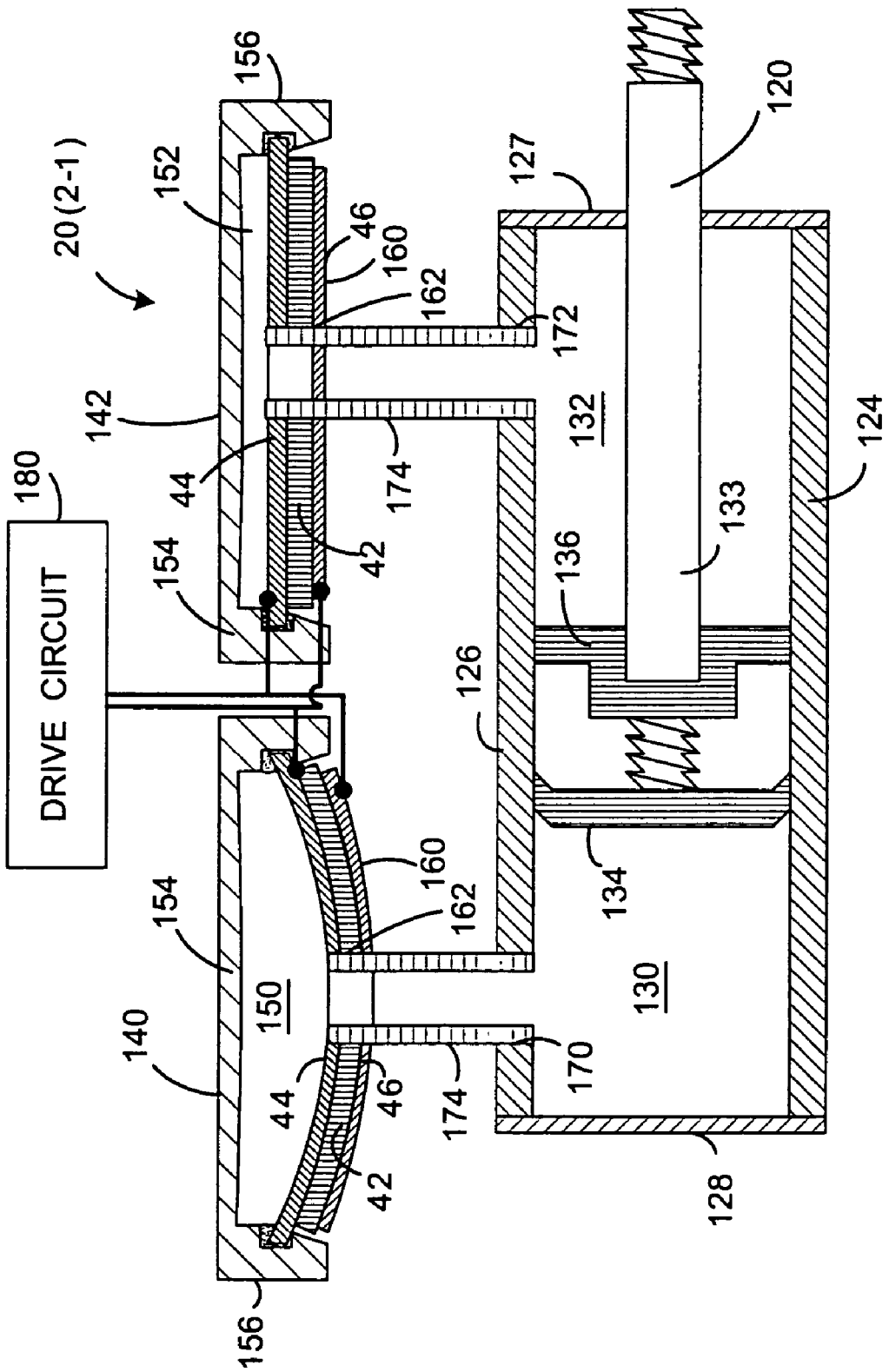
FIG. 7A and FIG. 7B are sectioned side views of a first example implementation of a second example embodiment, with FIG. 7A illustrating a retraction position of an actuator and FIG. 7B illustrating an extension position of the actuator.
Figure 7B:
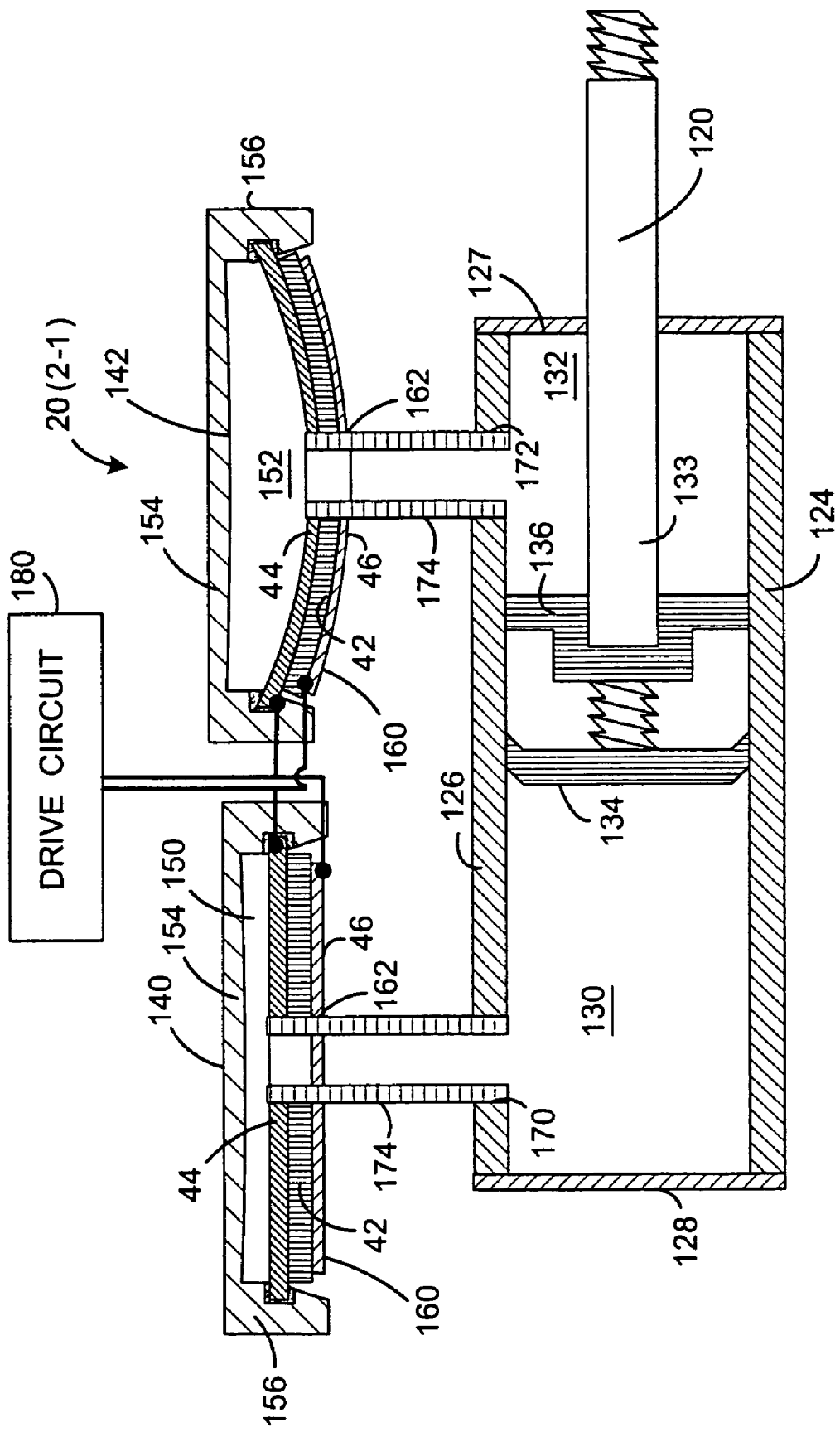

FIG. 7A and FIG. 7B illustrate a first example implementation of a second example embodiment wherein an actuator element 120 is at least partially situated in a housing 124, with the actuator element 120 being capable of reciprocating movement within the housing. In particular, FIG. 7A and FIG. 7B show an actuator assembly 20(2-1) wherein housing 124 comprises a cylindrical or tubular side wall 126. The actuator element 120 extends through a first end wall 127 secured to a first end of cylinder side wall 126. The first end wall 127 has an aperture through which actuator element 120 extends and reciprocates in sealed fashion. A second end of cylinder side wall 126 is sealed with a cap or end wall 128.

With respect to housing 124, the actuator element 120 at least partially defines a first variable fluidic chamber 130 and a second variable fluidic chamber 132. The actuator element 120 comprises an actuator shaft 133, a distal end of which extends through first end wall 127 for connection to an unillustrated worked device or element. A proximal end of actuator element 120 carries or has integral thereto an actuator head 134. The actuator head 134 has a sufficient radius so that peripheral edges of actuator head 134 sealingly slide on the interior of cylinder side wall 126 as actuator element 120 reciprocates. An exterior surface of actuator head 134 bears against the first working fluid in first variable fluidic chamber 130. Spaced slightly distally from actuator head 134 the actuator shaft 133 carries a shoulder seal 136. The actuator shaft 133 may be threaded or the like to adjust a distance separating shoulder seal 136 from actuator head 134. The shoulder seal 136 also has a sufficient radius so that peripheral edges of shoulder seal 136 sealingly slide on the interior of cylinder side wall 126 as actuator element 120 reciprocates. One face of shoulder seal 136 contacts or bears against the second working fluid in second variable fluidic chamber 132.

Sealing of the actuator element 120 relative to the housing 124, such as sealing of actuator shaft 133 through the aperture in first end wall 127 may be accomplished using various sealing elements. Alternatively, sealing may be effected based on composition of materials, such as having a glass tubular side wall 126 and a graphite actuator element 120.

The actuator assembly 20(2-1) further comprises a first piezoelectric assembly 140 and a second piezoelectric assembly 142. The first piezoelectric assembly 140 comprises a first variable reservoir 150 connected to the first variable fluidic chamber 130; the second piezoelectric assembly 142 comprises a second variable reservoir 152 connected to the second variable fluidic chamber 132. Both the first variable reservoir 150 and the second variable reservoir 152 are at least partially formed with a piezoelectric material.

In the first example implementation of the second embodiment as shown in FIG. 7A and FIG. 7B, the first piezoelectric assembly 140 and second piezoelectric assembly 142 comprise a relatively hard half shell housing 154 on one side and a piezoelectric material on another side. The half shell housing 154 has edges 156 which clamp, seal, or otherwise maintain peripheral edges of the piezoelectric material in place. For each of first piezoelectric assembly 140 and second piezoelectric assembly 142, the variable reservoir is formed between the half shell housing and the piezoelectric diaphragm.

In the example implementations illustrated herein, the piezoelectric material comprising each of first piezoelectric assembly 140 and first variable reservoir 150 are piezoelectric diaphragms 160 such as those described in conjunction with the example implementations of the first example embodiment. As such, the piezoelectric diaphragms 160 comprise piezoelectric wafer 42; substrate layer 44; and outer metal layer 46. Each piezoelectric diaphragm 160 has a diaphragm aperture 162 formed therein, preferably centrally. It should be understood that piezoelectric diaphragms other than those described with reference to the first example embodiment can also be utilized for the actuator assemblies of the second embodiment.

The housing 124 has a first radial port 170 formed on cylinder side wall 126 in the vicinity of first variable fluidic chamber 130 and a second radial port 172 formed on cylinder side wall 126 in the vicinity of second variable fluidic chamber 132. The first radial port 170 and the second radial port 172 are positioned and aligned with the diaphragm apertures 162 of first piezoelectric assembly 140 and second piezoelectric assembly 142, respectively, and are respectively connected to the diaphragm apertures 162 by conduits 174. The conduits 174 may take the form of sleeves or tubes, or any other suitable fluid-carrying passageway.

In view of the foregoing, a first conduit 174 connects first radial port 170 of housing 124 with the diaphragm aperture 162 of first piezoelectric assembly 140, while a second conduit 174 connects second radial port 172 of housing 124 with the diaphragm aperture 162 of second piezoelectric assembly 142. The connections provided by conduits 174 are fluid tight, and yet allow for movement (e.g., deflection) of the piezoelectric diaphragms 160 and of the entire piezoelectric assembly.

The first working fluid fully occupies a circuit which includes the first variable reservoir 150 and the first variable fluidic chamber 130, as well as the conduit 174 which connects them. In similar manner, the second working fluid fully occupies the second variable reservoir 152 and the second variable fluidic chamber 132, as well as the conduit 174 which connects them. The first working fluid and the second working fluid are separated in housing 124 by the actuator head 134 which contacts the first working fluid and by the shoulder seal 136 which contacts the second working fluid.

A driver 180 (e.g., drive circuit) applies signals to the piezoelectric diaphragm 160 comprising the first piezoelectric assembly 140 and to the piezoelectric diaphragm 160 comprising the second piezoelectric assembly 142. In so driving the piezoelectric diaphragms 160 of first piezoelectric assembly 140 and second piezoelectric assembly 142, as shown in FIG. 7B the first variable reservoir 150 contracts and the second variable reservoir 152 expands during an extension movement of the actuator element. On the other hand, as shown in FIG. 7A, the first variable reservoir 150 expands and the second variable reservoir 152 contracts during a withdrawal movement of the actuator element.

The driving signals are applied to cause the first variable reservoir 150 to contract and the second variable reservoir 152 to expand during an extension movement of the actuator element 120. In so doing, and as shown in FIG. 7B, a preponderance of the first working fluid is driven into first variable fluidic chamber 130, thereby acting on actuator head 134 to cause shoulder seal 136 to drive a preponderance of the second working fluid from second variable fluidic chamber 132 into second variable reservoir 152, which is accommodatingly expanded by application of the signals. Conversely, during a withdrawal movement of the actuator element 120 as shown in FIG. 7A, the signals are applied to cause the first variable reservoir 150 to expand and the second variable reservoir 152 to contract. With the contraction of second variable reservoir 152, a preponderance of the second working fluid is driven into second variable fluidic chamber 132, thereby acting against the shoulder seal 136 of actuator element 120, which urges actuator element 120 to the withdrawn position as the first variable reservoir 150 expands to receive the first working fluid driven therefrom.

Figure 8A:
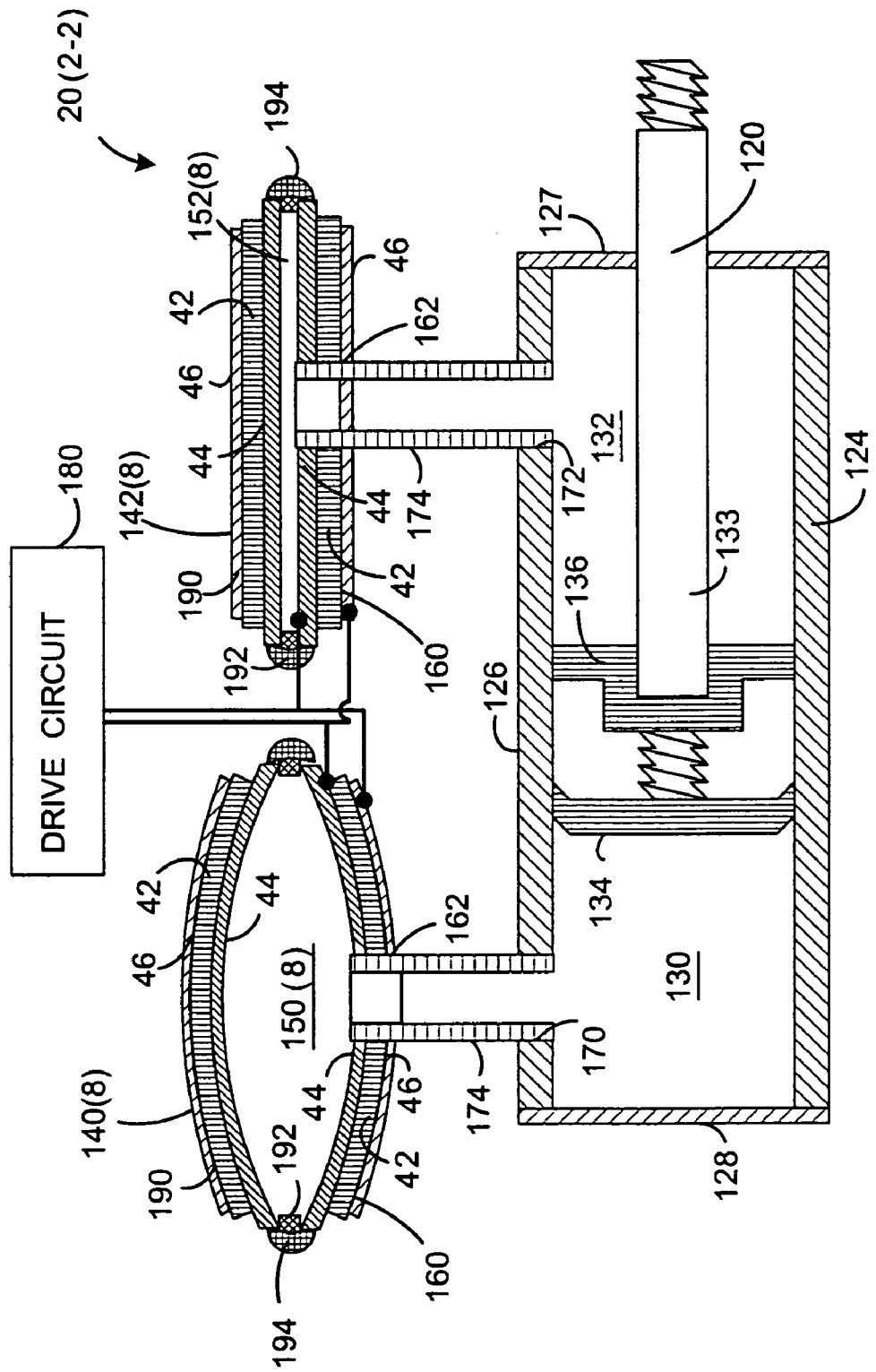
FIG. 8A and FIG. 8B are sectioned side views of a second example implementation of the second example embodiment, with FIG. 8A illustrating a retraction position of an actuator and FIG. 8B illustrating an extension position of the actuator.
Figure 8B:
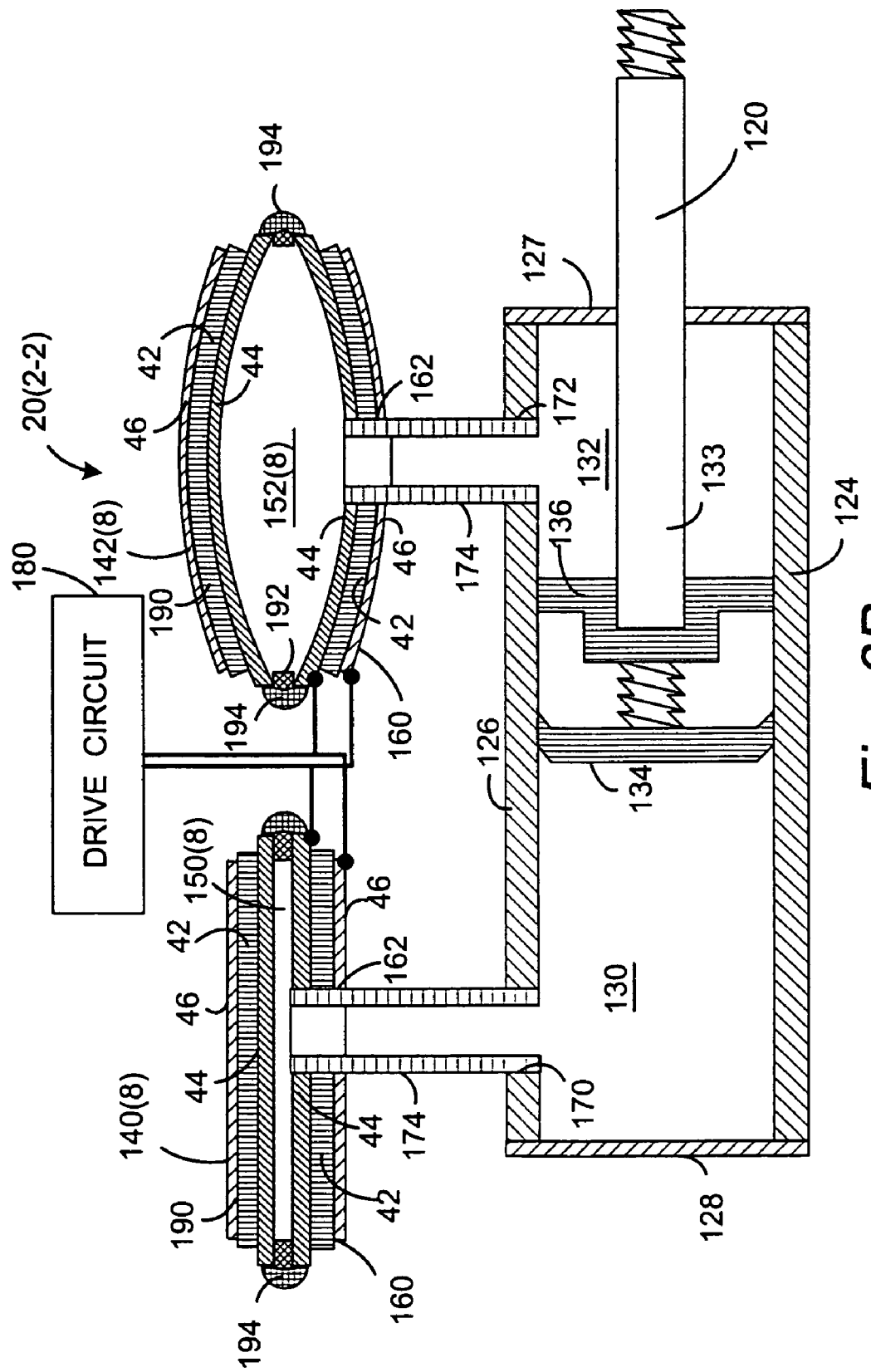

FIG. 8A and FIG. 8B show a second example implementation of the second embodiment. The second example implementation of FIG. 8A and FIG. 8B s primarily differs from the first example implementation of the second embodiment in that both halves of first piezoelectric assembly 140(8) and second piezoelectric assembly 142(8) are formed with piezoelectric diaphragms. That is, in the FIG. 8A and FIG. 8B implementation, the first piezoelectric assembly 140(8) which defines the first variable reservoir 130(8) and the second piezoelectric assembly 142(8) which defines the second variable reservoir 132(8) each comprise a first diaphragm 160 having a first diaphragm edge and a second diaphragm 190 having a second diaphragm edge. The first diaphragm edge and the second diaphragm edge are bonded together so that a variable reservoir volume is formed between the first diaphragm and the second diaphragm. In the particular example implementation shown in FIG. 8A and FIG. 8B, at least one of the first diaphragm 160 and the second diaphragm 190 are a piezoelectric diaphragm which displaces in accordance with application of an electrical signal. In other implementations, it is not required that either diaphragm be a piezoelectric diaphragm.

The bonding of piezoelectric diaphragm 160 and second diaphragm 190 can be realized in various ways. For example, a sealing gasket 192 may be inserted between an edge of diaphragm 160 and an edge of diaphragm 190, and an epoxy 194 or other adhesive or sealant applied exteriorly over the two edges of the respective diaphragms, and over sealing gasket 192. Although not necessarily so in every implementation, in the illustrated implementation the sealing gasket 192 and epoxy 194 reside essentially completely around the edges of the diaphragm 160 and diaphragm 190. In the particular implementations and examples illustrated herein, both diaphragm 160 and diaphragm 190 are essentially circular shaped diaphragms having an axial direction and a longitudinal or diameter direction. While circular, oval, or elliptical shaped diaphragms are currently preferred, other shapes of diaphragms are also possible. Structures and information suitable for this second example implementation of the second embodiment are also understood from U.S. patent application Ser. No. 11/024,943, filed Dec. 30, 2004, entitled "PUMPS WITH DIAPHRAGMS BONDED AS BELLOWS", which is incorporated herein by reference in its entirety.

The drive signals are applied to cause the first variable reservoir 150(8) to contract and the second variable reservoir 152(8) to expand during an extension movement of the actuator element 120. In so doing, and as illustrated in FIG. 8B, a preponderance of the first working fluid is driven into first variable fluidic chamber 130, thereby acting on actuator head 134 to cause shoulder seal 136 to drive a preponderance of the second working fluid from second variable fluidic chamber 132 into second variable reservoir 152(8), which is accommodatingly expanded by application of the signals. Conversely, during a withdrawal movement of the actuator element 120 illustrated in FIG. 8A, the signals are applied to cause the first variable reservoir 150(8) to expand and the second variable reservoir 152(8) to contract. With the contraction of second variable reservoir 152(8), a preponderance of the second working fluid is driven into second variable fluidic chamber 132, thereby acting against the shoulder seal 136 of actuator element 120, which urges actuator element 120 to the withdrawn position as the first variable reservoir 150(8) expands to receive the first working fluid driven therefrom.

The first example implementation (FIG. 7A and FIG. 7B) and the second example implementation (FIG. 8A and FIG. 8B) of the second embodiment provide temperature compensation for the piezoelectric diaphragms employed therein particularly when the volume of the entire circuit for the first working fluid and the volume of the first working fluid equals the volume of the entire circuit for the second working fluid and the volume of the second working fluid. As indicated above, the respective circuits include not only the variable reservoir, and the variable fluidic chamber, but also the conduit which connects them.

Figure 9:
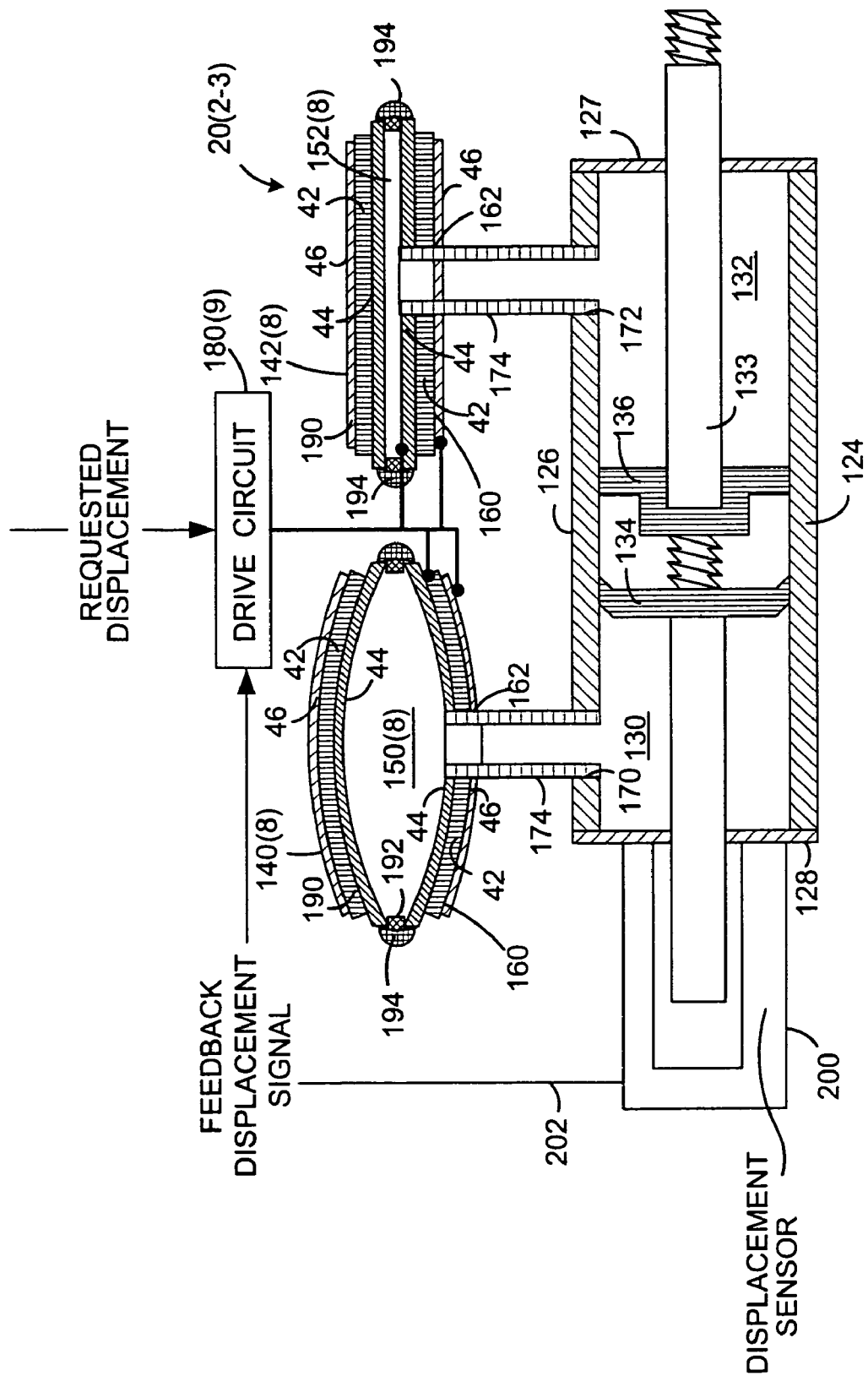
FIG. 9 is a sectioned side view of a third example implementation of the second example embodiment, illustrating a retraction position of an actuator and a displacement feedback loop for controlling positioning of the actuator.

FIG. 9 illustrates an enhanced version of the second example implementation of the second embodiment, i.e., actuator assembly 20(2-3). The actuator assembly 20(2-3) of FIG. 9 resembles the actuator assembly 20(2-2) of FIG. 8A and FIG. 8B, but differs by additionally having a displacement sensor 200 provided for detecting a degree of displacement of the actuator element 120 and for generating a feedback signal 202 for application to the driver 180(9). The driver 180(9) can compare the feedback signal 202 with a requested displacement, and accordingly apply appropriate signals to piezoelectric diaphragm 160 and second diaphragm 190 of the first piezoelectric assembly 140(8) and first piezoelectric assembly 140(8), in the manner previously described, for obtaining a suitable, i.e., desired, degree of displacement of actuator element 120. FIG. 9 shows a retraction position of actuator 120. No companion view of the extension position of the actuator element 120 of FIG. 9 is shown, such being understood (for example) with reference to FIG. 8B.

Figure 10A:
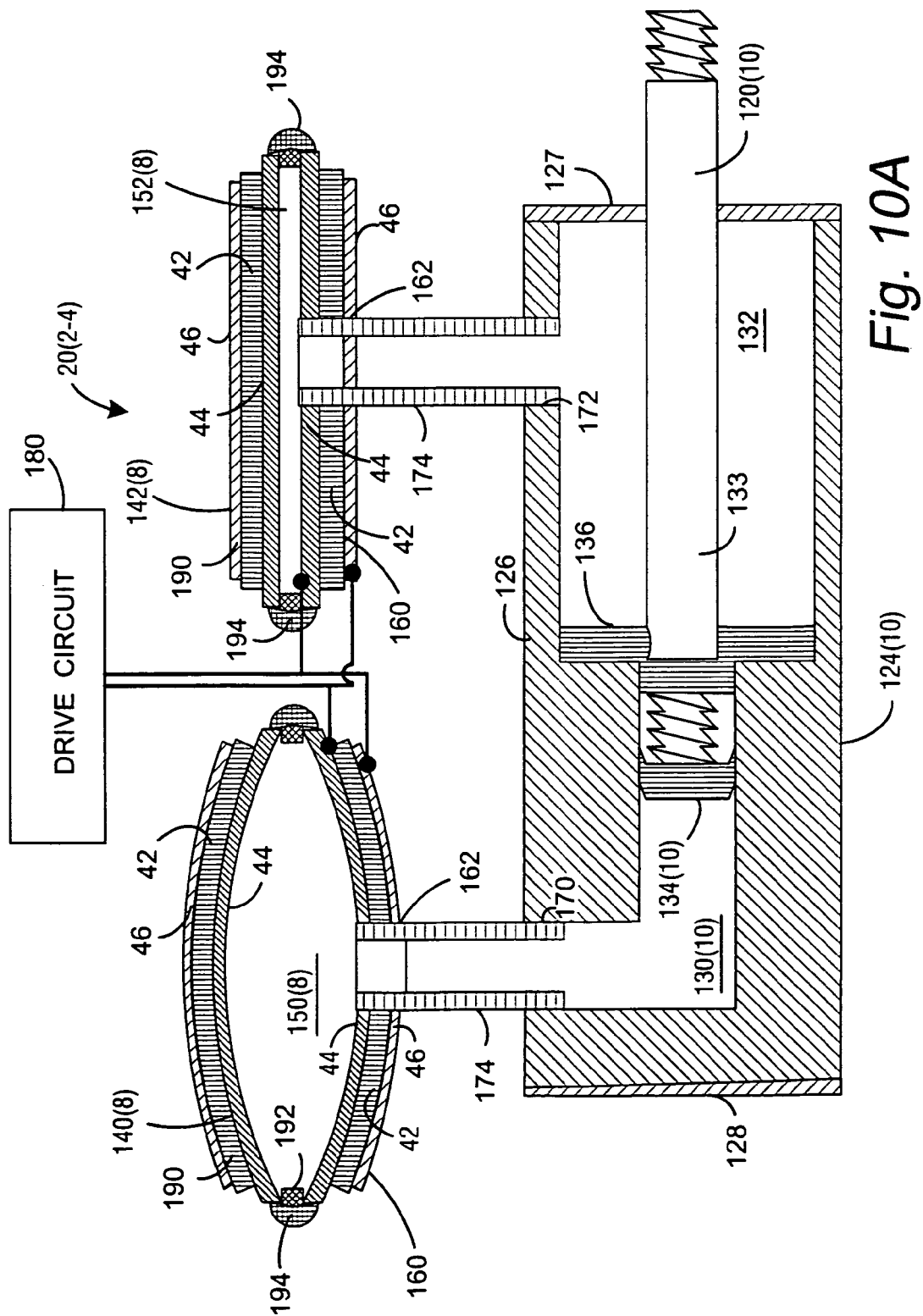
FIG. 10A and FIG. 10B are sectioned side views of a fourth example implementation of the second example embodiment, with FIG. 10A illustrating a retraction position of an actuator and FIG. 10B illustrating an extension position of the actuator.
Figure 10B:
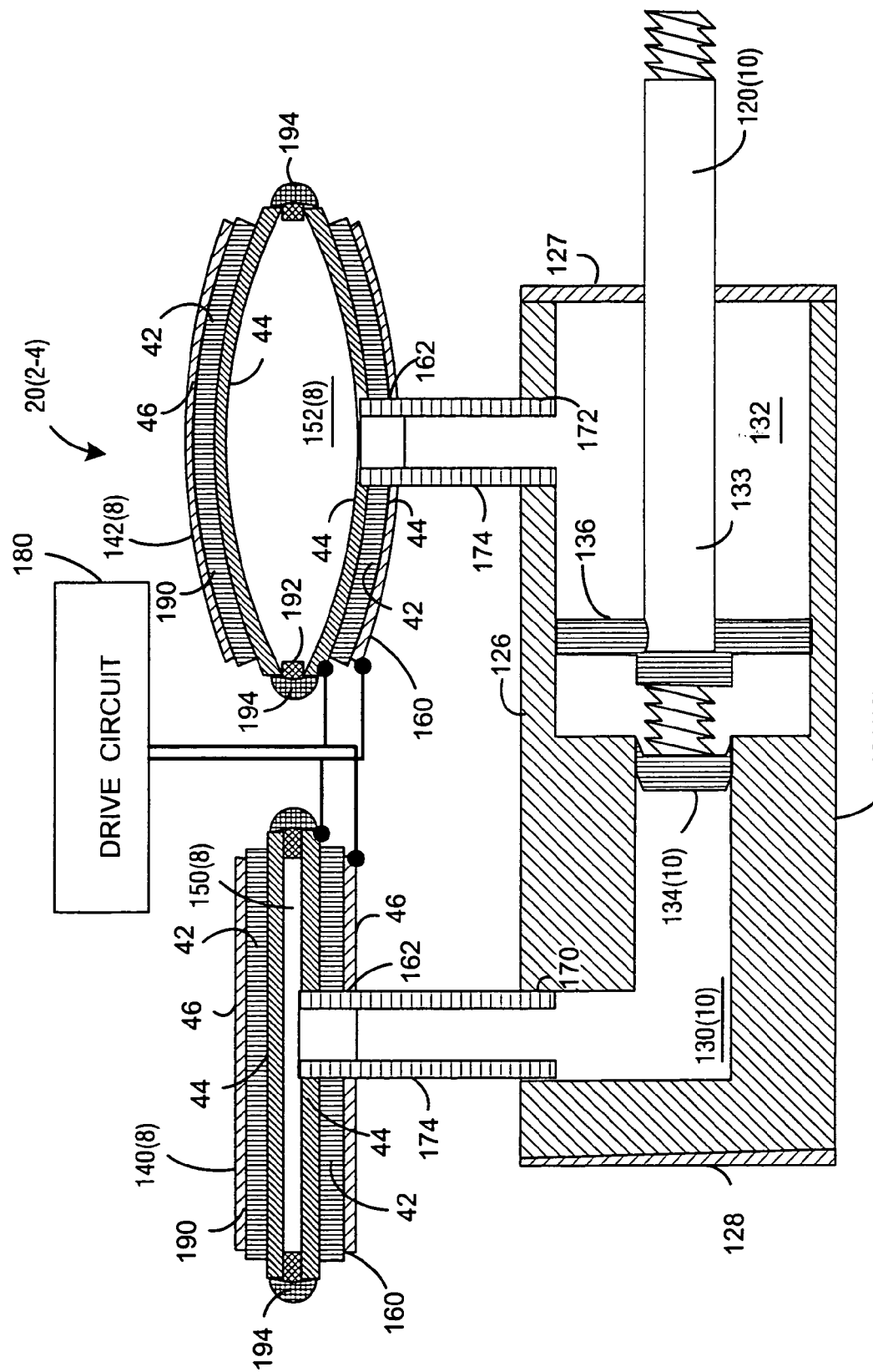

The displacement sensor 200 can be any type suitable for detecting movement or discrete positioning of actuator element 120. Examples of displacement sensor 200 include an optical sensor, or a Linear Variable Differential Transformer (VLDT) sensor FIG. 10A and FIG. 10B show a fourth example implementation of the second example embodiment, i.e., actuator assembly 20(2-4). The actuator assembly 20(2-4) of FIG. 10A and FIG. 10B resembles the actuator assembly 20(2-2) of FIG. 8A and FIG. 8B, but differs in the configuration of first variable fluidic chamber 130(10) in housing 124(10). In particular, the housing 124(10) has a constrained or smaller internal diameter for first variable fluidic chamber 130(10) as compared to first variable fluidic chamber 130 of actuator assembly 20(2-2) of the implementation of FIG. 8A and FIG. 8B. The actuator head 134(10) of actuator element 120(10) of FIG. 10A and FIG. 10B has a concomitantly smaller diameter as well, with actuator head 134(10) still reciprocating in sealed manner within the reduced diameter bore of first variable fluidic chamber 130(10). FIG. 10A shows a retraction position of actuator 120(10); FIG. 10B shows an extended position of actuator element 120(10). The application of signals to the first piezoelectric assembly 140 and second piezoelectric assembly 142 for both retracting and extending the actuator element 120(10) is understood with reference to the preceding example implementations.

The actuator assembly 20(2-4) of FIG. 10A and FIG. 10B with its constrained first variable fluidic chamber 130(10) serves to provide an enhanced actuator stroke for actuator element 120(10) as compared to the example implementation of FIG. 8A and FIG. 8B, but has decreased actuator force. Thus, it is apparent that, in accordance with needs of the application or field of use, the actuator assemblies of the second embodiment can be configured to achieve a desire amount of stroke and/or force by, e.g., appropriately configuring internal structure of the housing.

Figure 11A:
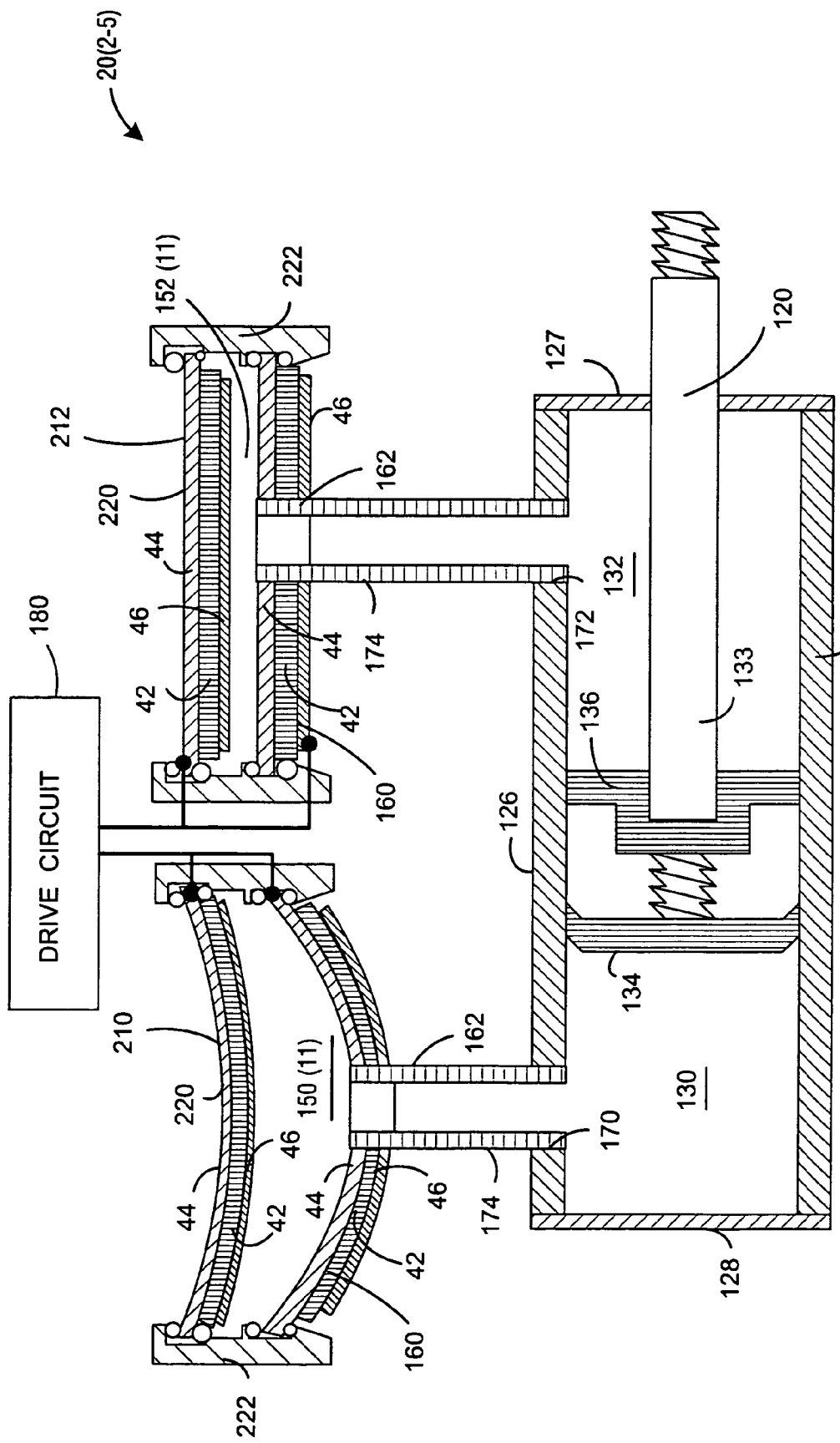
FIG. 11A and FIG. 11B are sectioned side views of a fifth example implementation of the second example embodiment, with FIG. 11A illustrating a retraction position of an actuator and FIG. 11B illustrating an extension position of the actuator.
Figure 11B:
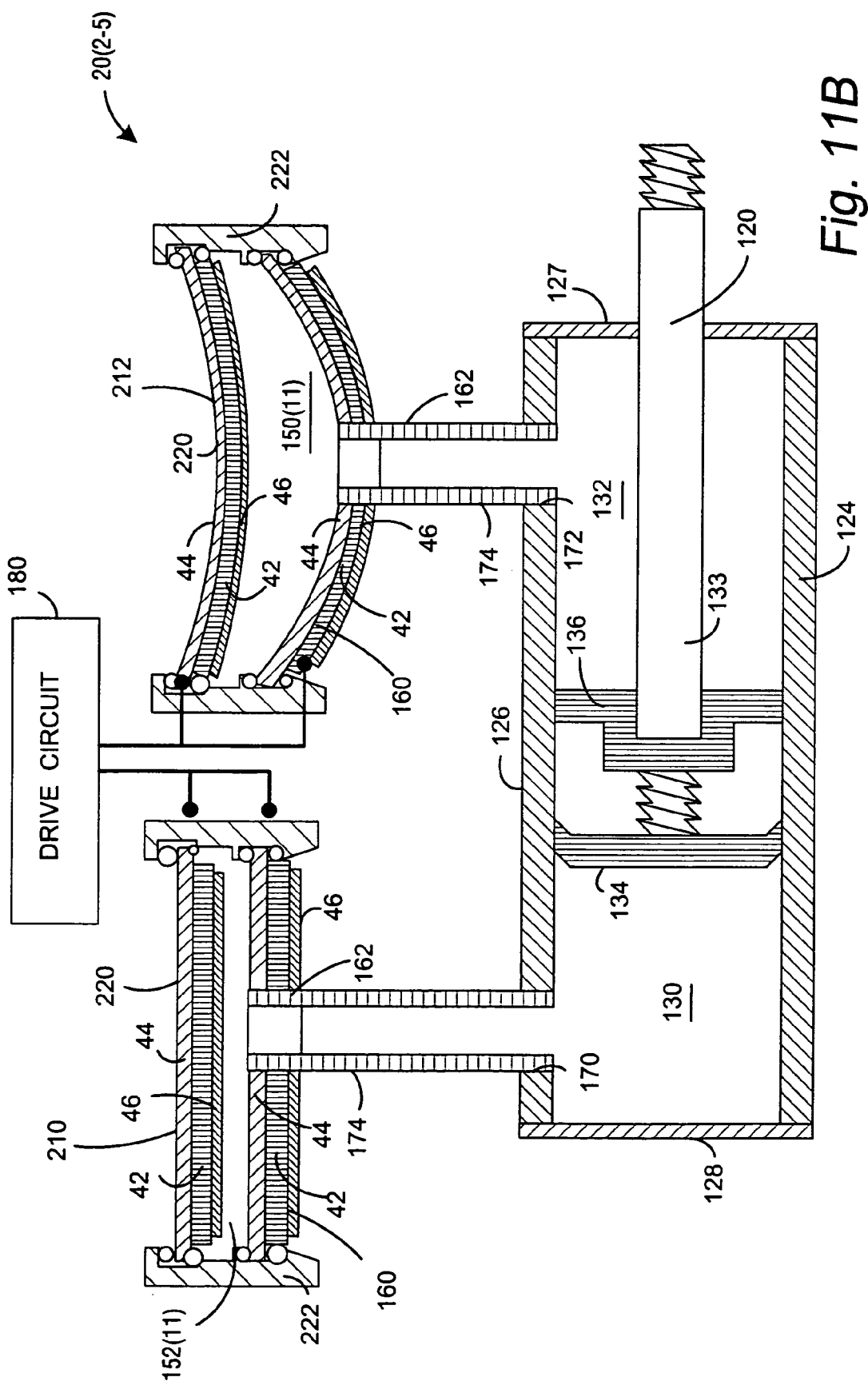

FIG. 11A and FIG. 11B show a fifth example implementation of the second example embodiment, i.e., actuator assembly 20(2-5). FIG. 11A illustrates a retraction position of actuator 120 and FIG. 11B illustrates an extension position of the actuator 120. The actuator assembly 20(2-5) of FIG. 11A and FIG. 11B resembles the actuator assembly 20(2-2) of FIG. 8A and FIG. 8B, but differs in the configuration of both the first piezoelectric assembly and the second piezoelectric assembly. In particular, both the first piezoelectric assembly 210 and the second piezoelectric assembly 212 have two diaphragms, but the two diaphragms are not directly edge connected in the manner of the implementation of FIG. 8A and FIG. 8B. Both first piezoelectric assembly 210 and second piezoelectric assembly 212 have a piezoelectric diaphragm 160 which resembles the aperture-containing, comparably numeraled diaphragm of FIG. 8A and FIG. 8B. The second diaphragm 220 of both the first piezoelectric assembly 210 and second piezoelectric assembly 212 is held apart from piezoelectric diaphragm 160 by a ring-shaped spacer 222. On its interior surface, spacer 222 has ledges and indentations for grasping or clamping the substrate layer 44 of each diaphragm, i.e., piezoelectric diaphragm 160 and second diaphragm 220. Gaskets or seals can be employed to retain the substrate layer 44 of the diaphragms in spacer 222.

The first piezoelectric assembly 210 and second diaphragm 220 of the example implementation of FIG. 11A and FIG. 11B can have their diaphragms shaped as circular disks which, in absence of electrical signal and thermal stress, are slightly bowed. Moreover, the first piezoelectric assembly 210 and second diaphragm 220 of the example implementation of FIG. 11A and FIG. 11B can have their diaphragms oriented in a temperature compensating manner. In this regard, the piezoelectric diaphragm 160 and second diaphragm 220 are both oriented in a convex manner as viewed from the radial ports through which fluid communicates into the respective variable reservoirs formed by first piezoelectric assembly 210 and second piezoelectric assembly 212. In this regard, that the first piezoelectric assembly 210 and second piezoelectric assembly 212 of the implementation of FIG. 11A and FIG. 11B resemble the third example implementation of the first embodiment, but with the order of the layers of the piezoelectric diaphragm reversed. With respect to the resemblance, as seen from first radial port 170, as unactivated (e.g., absence of electrical signal) main piezoelectric diaphragm 30 has a slightly concave shape and carriage piezoelectric diaphragm 40 has a slightly convex shape.

The first piezoelectric assembly 210 and second diaphragm 220 of the example implementation of FIG. 11A and FIG. 11B can also have their diaphragms oriented in a temperature compensating manner as in any of the example implementations of the first embodiment. For example, and as seen from the radial ports of housing 124, first piezoelectric diaphragm 160 (when unactivated) can have a slightly concave shape like main piezoelectric diaphragm 30 of the first example implementation of the first embodiment, and second diaphragm 220 (when unactivated) can have a slightly convex shape like carriage piezoelectric diaphragm 40 of the same implementation. Alternately, first piezoelectric diaphragm 160 (when unactivated) can have a slightly convex shape like main piezoelectric diaphragm 30 of the second example implementation of the first embodiment, and second diaphragm 220 (when unactivated) can have a slightly concave shape like carriage piezoelectric diaphragm 40 of the same implementation. Or, as another alternative, first piezoelectric diaphragm 160 (when unactivated) can have a slightly concave shape like main piezoelectric diaphragm 30 of the third example implementation of the first embodiment, and second diaphragm 220 (when unactivated) can have a slightly concave shape like carriage piezoelectric diaphragm 40 of the same implementation.

The temperature compensation of each of the above-described variations of the fifth example implementation of the second embodiment arises from the fact that thermal stress affects both piezoelectric diaphragm 160 and second diaphragm 220 of each piezoelectric assembly similarly, so that the expanded volume of each variable reservoir 150, 152 remains constant despite thermal changes in the piezoelectric, and the contracted volume of each variable reservoir 150, 152 remains constant despite thermal changes in the piezoelectric. In essence, any tendency for temperature distortion for a piezoelectric diaphragm is cancelled by the other piezoelectric diaphragm which works in tandem therewith to form the respective variable reservoir.

The actuator assemblies of the example implementations of all example embodiments can perform myriad purposes and can be incorporated in or utilized with other elements or devices. For example, the actuator element may be connected, coupled, or linked to a spool valve or a servo valve.

Although various embodiments have been shown and described in detail, the claims are not limited to any particular embodiment or example. None of the above description should be read as implying that any particular element, step, range, or function is essential such that it must be included in the claims scope. The scope of patented subject matter is defined only by the claims. The extent of legal protection is defined by the words recited in the allowed claims and their equivalents. It is to be understood that the invention is not to be limited to the disclosed embodiment, but on the contrary, is intended to cover various modifications and equivalent arrangements.

What is claimed is:

1. An actuator assembly comprising:
    a housing;
    an actuator element configured for reciprocating movement at least partially within the housing;
    wherein, with respect to the housing, the actuator element at least partially defines a first variable fluidic chamber and a second variable fluidic chamber;
    a first piezoelectric assembly comprising a first variable reservoir connected to the first variable fluidic chamber;
    a second piezoelectric assembly comprising a second variable reservoir connected to the second variable fluidic chamber, both the first variable reservoir and the second variable reservoir being at least partially formed with a piezoelectric material;
    a first working fluid for occupying the first variable reservoir and the first variable fluidic chamber;

a second working fluid for occupying the second variable reservoir and the second variable fluidic chamber;

the first piezoelectric assembly and the second piezoelectric assembly being arranged whereby a temperature dependency of the first piezoelectric assembly is cancelled by the temperature dependency of the second piezoelectric assembly.

2. The apparatus of claim 1, wherein the first variable reservoir and the second variable reservoir each comprise:
a first diaphragm having a first diaphragm edge;
a second diaphragm having a second diaphragm edge;
the first diaphragm edge and the second diaphragm edge being bonded together so that a variable reservoir volume is formed between the first diaphragm and the second diaphragm;
at least one of the first diaphragm and the second diaphragm being a piezoelectric diaphragm which displaces in accordance with application of an electrical signal.

3. The apparatus of claim 1, wherein the first variable reservoir and the second variable reservoir each comprise:
a first diaphragm having a first diaphragm edge;
a second diaphragm having a second diaphragm edge;
the first diaphragm edge and the second diaphragm edge held by a spacer so that a variable reservoir volume is formed between the first diaphragm and the second diaphragm;
at least one of the first diaphragm and the second diaphragm being a piezoelectric diaphragm which displaces in accordance with application of an electrical signal.

4. The apparatus of claim 3, wherein the first piezoelectric diaphragm and the second piezoelectric diaphragm are arranged whereby a temperature dependency of the first piezoelectric diaphragm is cancelled by the temperature dependency of the second piezoelectric diaphragm.

5. The apparatus of claim 1, further comprising a driver which applies signals to the piezoelectric material comprising the first variable reservoir and the second variable reservoir for causing the first variable reservoir to contract and the second variable reservoir to expand during an extension movement of the actuator element and for causing the first variable reservoir to expand and the second variable reservoir to contract during a withdrawal movement of the actuator element.

6. The apparatus of claim 5, further comprising a displacement sensor for detecting a degree of displacement of the actuator element and generating a feedback signal for application to the driver.

7. A method of operating an actuator assembly, the actuator assembly comprising an actuator element for reciprocating at least partially within a housing, the actuator element at least partially defining a first variable fluidic chamber and a second variable fluidic chamber with respect to the housing, a first variable reservoir being connected to the first variable fluidic chamber and a second variable reservoir being connected to the second variable fluidic chamber, both the first variable reservoir and the second variable reservoir being at least partially formed with a piezoelectric material, a first working fluid occupying the first variable reservoir and the first variable fluidic chamber and a second working fluid for occupying the second variable reservoir and the second variable fluidic chamber, the method comprising:

applying the signal to the piezoelectric material comprising the first variable reservoir and the second variable reservoir for causing the first variable reservoir to contract and the second variable reservoir to expand during an extension movement of the actuator element;

applying a signal to the piezoelectric material comprising th first variable reservoir and the second variable reservoir for causing the first variable reservoir to expand and the second variable reservoir to contract during a withdrawal movement of the actuator element;

operating the first variable reservoir and the second variable reservoir whereby a temperature dependency of the first variable reservoir is cancelled by the temperature dependency of the second variable reservoir.

8. The method of claim 7, further comprising detecting a degree of displacement of the actuator element and generating a feedback signal for application to the driver.

9. The method of claim 7, wherein the piezoelectric material comprising the first variable reservoir comprises a first piezoelectric diaphragm and wherein the piezoelectric material comprising the second variable reservoir comprises a second piezoelectric diaphragm.

10. The method of claim 9, wherein the actuator element has an actuator axis, and wherein with respect to the actuator axis the method comprises:
providing one of the first piezoelectric diaphragm and the second piezoelectric diaphragm with a concave shape when unactivated;
providing another of the first piezoelectric diaphragm and the second piezoelectric diaphragm with a convex shape when unactivated.

11. The method of claim 10, further comprising providing the first piezoelectric diaphragm with the concave shape when unactivated and providing the second piezoelectric diaphragm with the convex shape when unactivated.

12. The method of claim 10, further comprising providing the first piezoelectric diaphragm with the convex shape when unactivated and providing the second piezoelectric diaphragm with the concave shape when unactivated.

13. The method of claim 9, wherein the actuator element has an actuator axis, and wherein with respect to the actuator axis the method further comprises providing both the first piezoelectric diaphragm and the second piezoelectric diaphragm with a concave shape when unactivated.

14. An actuator assembly comprising:
an actuator element;
a first piezoelectric assembly comprising a first piezoelectric diaphragm connected to the actuator element and configured for displacing the actuator element in response to displacement of the first piezoelectric diaphragm;
a second piezoelectric assembly comprising a second piezoelectric diaphragm;
the first piezoelectric assembly and the second piezoelectric assembly being arranged whereby a temperature dependency of the first piezoelectric assembly is cancelled by the temperature dependency of the second piezoelectric assembly;
a movable carriage configured for mounting the first piezoelectric diaphragm;
the second piezoelectric diaphragm being connected to the carriage and configured for displacing the carriage in response to displacement of the second piezoelectric diaphragm;
wherein a peripheral edge of the second piezoelectric diaphragm is fixed; and
wherein the movable carriage rigidly connects a center of the second piezoelectric diaphragm to a peripheral edge of the first piezoelectric diaphragm.

15. The apparatus of claim 14, further comprising a driver for applying electrical signals to the first piezoelectric diaphragm and the second piezoelectric diaphragm for causing the first piezoelectric diaphragm and the second piezoelectric diaphragm to displace in the same direction.

16. The apparatus of claim 14, wherein the actuator element has an actuator axis, and wherein with respect to the actuator axis one of the first piezoelectric diaphragm and the second piezoelectric diaphragm has a concave shape when unactivated and another of the first piezoelectric diaphragm and the second piezoelectric diaphragm has a convex shape when unactivated.

17. The apparatus of claim 16, wherein the first piezoelectric diaphragm has the concave shape when unactivated and the second piezoelectric diaphragm has the convex shape when unactivated.

18. The apparatus of claim 16, wherein the first piezoelectric diaphragm has the convex shape when unactivated and the second piezoelectric diaphragm has the concave shape when unactivated.

19. An actuator assembly comprising:
    an actuator element;
    a first piezoelectric assembly comprising a first piezoelectric diaphragm connected to the actuator element and configured for displacing the actuator element in response to displacement of the first piezoelectric diaphragm;
    a second piezoelectric assembly comprising a second piezoelectric diaphragm;
    the first piezoelectric assembly and the second piezoelectric assembly being arranged whereby a temperature dependency of the first piezoelectric assembly is cancelled by the temperature dependency of the second piezoelectric assembly;
    a movable carriage configured for mounting the first piezoelectric diaphragm;
    the second piezoelectric diaphragm being connected to the carriage and configured for displacing the carriage in response to displacement of the second piezoelectric diaphragm;
    wherein a peripheral edge of the second piezoelectric diaphragm is fixed; and
    wherein the actuator element is rigidly connected to a peripheral edge of the first piezoelectric diaphragm.

20. The apparatus of claim 19, wherein the actuator element has an actuator axis, and wherein with respect to the actuator axis both the first piezoelectric diaphragm and the second piezoelectric diaphragm have a concave shape when unactivated.

21. The apparatus of claim 19, wherein a center of the first piezoelectric diaphragm is rigidly connected to a center of the second piezoelectric diaphragm by the moveable carriage.

22. The apparatus of claim 19, further comprising a driver for applying electrical signals to the first piezoelectric diaphragm and the second piezoelectric diaphragm for causing the first piezoelectric diaphragm and the second piezoelectric diaphragm to displace in the same direction.

23. An actuator assembly comprising:
    an actuator element;
    a first piezoelectric assembly comprising a first piezoelectric diaphragm connected to the actuator element and configured for displacing the actuator element in response to displacement of the first piezoelectric diaphragm;
    a second piezoelectric assembly comprising a second piezoelectric diaphragm;
    the first piezoelectric assembly and the second piezoelectric assembly being arranged whereby a temperature dependency of the first piezoelectric assembly is cancelled by the temperature dependency of the second piezoelectric assembly;
    a movable carriage configured for mounting the first piezoelectric diaphragm;
    the second piezoelectric diaphragm being connected to the carriage and configured for displacing the carriage in response to displacement of the second piezoelectric diaphragm;
    wherein a center of the second piezoelectric diaphragm is fixed; and
    wherein the movable carriage rigidly connects a peripheral edge of the first piezoelectric diaphragm to a peripheral edge of the second piezoelectric diaphragm.

24. The apparatus of claim 23, further comprising a driver for applying electrical signals to the first piezoelectric diaphragm and the second piezoelectric diaphragm for causing the first piezoelectric diaphragm and the second piezoelectric diaphragm to displace in the same direction.

* * * * *